(12) United States Patent
Yu et al.

(10) Patent No.: US 8,266,367 B2
(45) Date of Patent: *Sep. 11, 2012

(54) MULTI-LEVEL STRIPING AND TRUNCATION CHANNEL-EQUALIZATION FOR FLASH-MEMORY SYSTEM

(75) Inventors: Frank Yu, Palo Alto, CA (US); Charles C. Lee, Cupertino, CA (US); Abraham C. Ma, Fremont, CA (US); Myeongjin Shin, San Ramon, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 424 days.

This patent is subject to a terminal disclaimer.

(21) Appl. No.: 12/475,457

(22) Filed: May 29, 2009

(65) Prior Publication Data

US 2009/0240873 A1    Sep. 24, 2009

Related U.S. Application Data

(63) Continuation-in-part of application No. 12/252,155, filed on Oct. 15, 2008, and a continuation-in-part of application No. 10/707,277, filed on Dec. 2, 2003, now Pat. No. 7,103,684, and a continuation-in-part of application No. 12/418,550, filed on Apr. 3, 2009, and a continuation-in-part of application No. 12/166,191, filed on Jul. 1, 2008, now Pat. No. 7,865,809, and a continuation-in-part of application No. 11/924,448, filed on Oct. 25, 2007, now abandoned, and a continuation-in-part of application No. 12/347,306, filed on Dec. 31, 2008, and a continuation-in-part of application No. 12/128,916, filed on May 29, 2008, now Pat. No. 7,552,251, and a continuation-in-part of application No. 11/309,594, filed on Aug. 28, 2006, now Pat. No. 7,383,362, and a continuation-in-part of application No. 12/186,471, filed on Aug. 5, 2008.

(51) Int. Cl.
*G06F 12/00* (2006.01)
*G06F 13/00* (2006.01)
*G06F 13/28* (2006.01)

(52) U.S. Cl. .......... 711/103; 711/E12.001; 711/E12.008

(58) Field of Classification Search .................. 711/103, 711/E12.001, E12.008
See application file for complete search history.

(56) References Cited

U.S. PATENT DOCUMENTS

| | | | |
|---|---|---|---|
| 5,905,993 A | | 5/1999 | Shinohara |
| 6,000,006 A | * | 12/1999 | Bruce et al. ................... 711/103 |
| 6,721,843 B1 | | 4/2004 | Estakhri |

(Continued)

*Primary Examiner* — Sheng-Jen Tsai
(74) *Attorney, Agent, or Firm* — Stuart T. Auvinen; gPatent LLC

(57) ABSTRACT

Truncation reduces the available striped data capacity of all flash channels to the capacity of the smallest flash channel. A solid-state disk (SSD) has a smart storage switch salvages flash storage removed from the striped data capacity by truncation. Extra storage beyond the striped data capacity is accessed as scattered data that is not striped. The size of the striped data capacity is reduced over time as more bad blocks appear. A first-level striping map stores striped and scattered capacities of all flash channels and maps scattered and striped data. Each flash channel has a Non-Volatile Memory Device (NVMD) with a lower-level controller that converts logical block addresses (LBA) to physical block addresses (PBA) that access flash memory in the NVMD. Wear-leveling and bad block remapping are preformed by each NVMD. Source and shadow flash blocks are recycled by the NVMD. Two levels of smart storage switches enable three-level controllers.

21 Claims, 32 Drawing Sheets

U.S. PATENT DOCUMENTS

| | | |
|---|---|---|
| 6,772,274 B1 | 8/2004 | Estakhri |
| 6,845,438 B1 * | 1/2005 | Tanaka et al. .................. 711/206 |
| 7,073,010 B2 | 7/2006 | Chen, et al. |
| 7,155,559 B1 * | 12/2006 | Estakhri et al. ............... 711/103 |
| 7,194,596 B2 | 3/2007 | Wu, et al. |
| 7,263,591 B2 | 8/2007 | Estakhri, et al. |
| 7,397,713 B2 * | 7/2008 | Harari et al. .................. 365/200 |
| 2004/0186946 A1 * | 9/2004 | Lee ................................. 711/103 |
| 2005/0108618 A1 * | 5/2005 | Gnaedig ........................ 715/500 |
| 2005/0157564 A1 * | 7/2005 | Hosono et al. ........... 365/189.01 |
| 2007/0083697 A1 | 4/2007 | Birrell et al. |
| 2008/0028131 A1 | 1/2008 | Kudo et al. |
| 2008/0028165 A1 | 1/2008 | Sukegawa |
| 2008/0098164 A1 * | 4/2008 | Lee et al. ....................... 711/103 |
| 2008/0155160 A1 | 6/2008 | McDaniel |
| 2008/0155177 A1 | 6/2008 | Sinclair et al. |
| 2008/0155182 A1 | 6/2008 | Kudo |
| 2008/0162792 A1 | 7/2008 | Wu et al. |
| 2008/0162793 A1 | 7/2008 | Chu et al. |
| 2008/0189490 A1 | 8/2008 | Cheon et al. |
| 2008/0320214 A1 * | 12/2008 | Ma et al. ........................ 711/103 |
| 2009/0074408 A1 * | 3/2009 | Black et al. ...................... 398/45 |
| 2009/0193184 A1 * | 7/2009 | Yu et al. ......................... 711/103 |
| 2009/0204872 A1 * | 8/2009 | Yu et al. ......................... 714/773 |

* cited by examiner

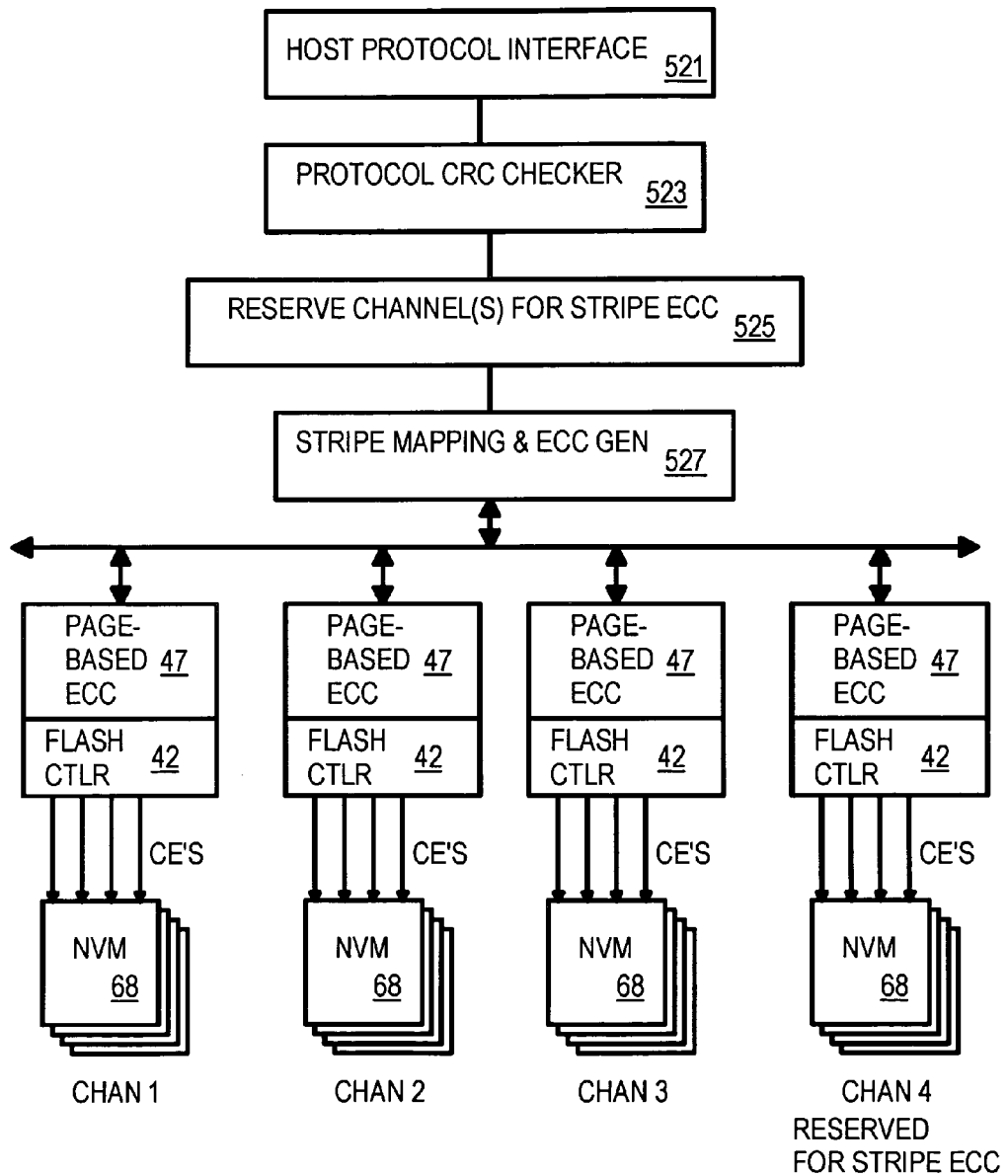

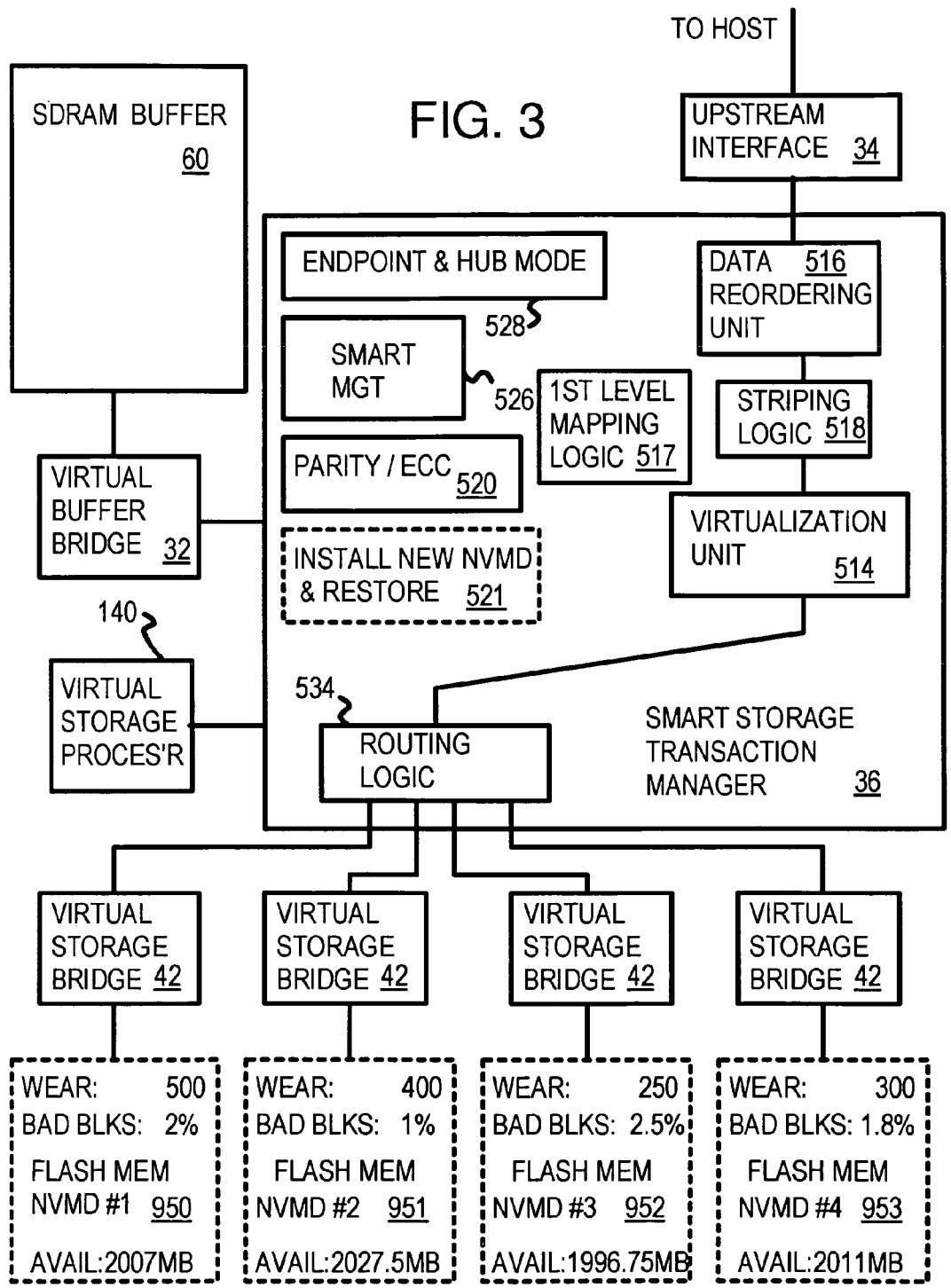

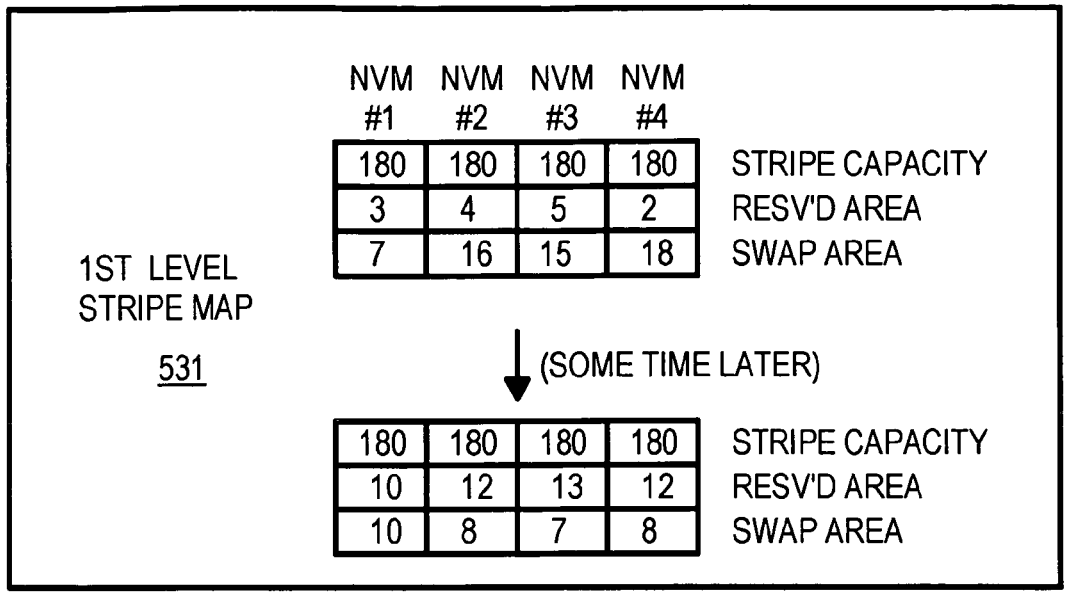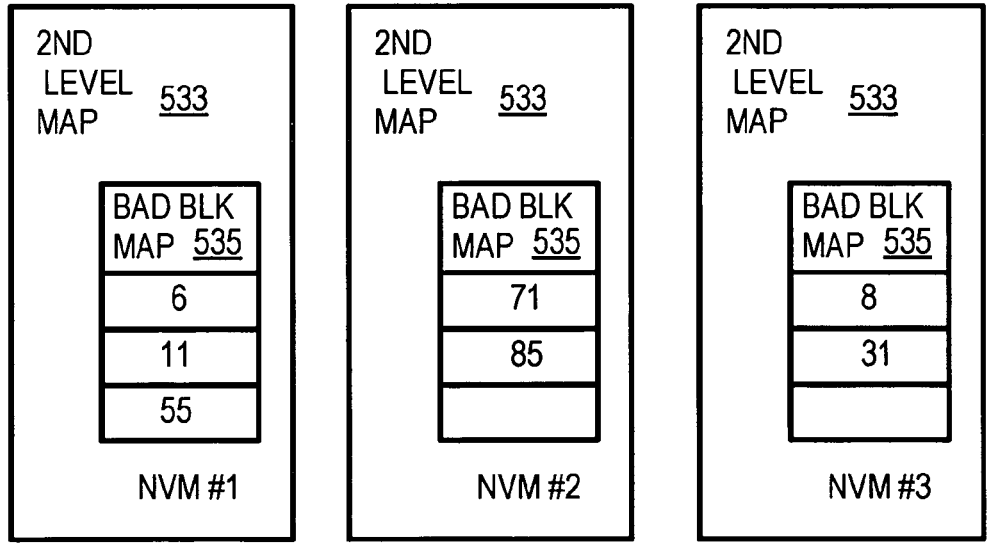
FIG. 4E

TOP VIEW

SIDE VIEW

MULTI-LEVEL STRIPING AND TRUNCATION CHANNEL-EQUALIZATION FOR FLASH-MEMORY SYSTEM

RELATED APPLICATIONS

This application is a continuation-in-part of the co-pending application for "Command Queuing Smart Storage Transfer Manager for Striping Data to Raw-NAND Flash Modules", Ser. No. 12/252,155, filed Oct. 15, 2008.

This application is a continuation-in-part (CIP) of "Multi-Level Controller with Smart Storage Transfer Manager for Interleaving Multiple Single-Chip Flash Memory Devices", U.S. Ser. No. 12/186,471, filed Aug. 5, 2008.

This application is a continuation-in-part (CIP) of co-pending U.S. patent application for "Single-Chip Multi-Media Card/Secure Digital controller Reading Power-on Boot Code from Integrated Flash Memory for User Storage", Ser. No. 12/128,916, filed on May 29, 2008, which is a continuation of U.S. patent application for "Single-Chip Multi-Media Card/Secure Digital controller Reading Power-on Boot Code from Integrated Flash Memory for User Storage", Ser. No. 11/309,594, filed on Aug. 28, 2006, now issued as U.S. Pat. No. 7,383,362, which is a CIP of U.S. patent application for "Single-Chip USB Controller Reading Power-On Boot Code from Integrated Flash Memory for User Storage", Ser. No. 10/707,277, filed on Dec. 2, 2003, now issued as U.S. Pat. No. 7,103,684.

This application is a continuation-in-part (CIP) of "Hybrid 2-Level Mapping Tables for Hybrid Block- and Page-Mode Flash-Memory System", U.S. Ser. No. 12/418,550, filed Apr. 3, 2009.

This application is also a CIP of co-pending U.S. patent application for "Data error detection and correction in non-volatile memory devices", U.S. application Ser. No. 12/166,191, filed Jul. 1, 2008.

This application is also a CIP of co-pending U.S. patent application for "Swappable Sets of Partial-Mapping Tables in a Flash-Memory System With A Command Queue for Combining Flash Writes", U.S. application Ser. No. 12/347,306, filed Dec. 31, 2008.

This application is also a CIP of co-pending U.S. patent application for "Portable Electronic Storage Devices with Hardware Security Based on Advanced Encryption Standard", U.S. application Ser. No. 11/924,448, filed Oct. 25, 2007.

FIELD OF THE INVENTION

This invention relates to flash-memory solid-state-drive (SSD) devices, and more particularly to salvaging truncated storage space by storing scattered non-striped data.

BACKGROUND OF THE INVENTION

Host systems such as Personal Computers (PC's) store large amounts of data in mass-storage devices such as hard disk drives (HDD). Mass-storage devices are sector-addressable rather than byte-addressable, since the smallest unit of flash memory that can be read or written is a page that is several 512-byte sectors in size. Flash memory is replacing hard disks and optical disks as the preferred mass-storage medium.

NAND flash memory is a type of flash memory constructed from electrically-erasable programmable read-only memory (EEPROM) cells, which have floating gate transistors. These cells use quantum-mechanical tunnel injection for writing and tunnel release for erasing. NAND flash is non-volatile so it is ideal for portable devices storing data. NAND flash tends to be denser and less expensive than NOR flash memory.

However, NAND flash has limitations. In the flash memory cells, the data is stored in binary terms—as ones (1) and zeros (0). One limitation of NAND flash is that when storing data (writing to flash), the flash can only write from ones (1) to zeros (0). When writing from zeros (0) to ones (1), the flash needs to be erased a "block" at a time. Although the smallest unit for read can be a byte or a word within a page, the smallest unit for erase is a block.

Single Level Cell (SLC) flash and Multi Level Cell (MLC) flash are two types of NAND flash. The erase block size of SLC flash may be 128K+4K bytes while the erase block size of MLC flash may be 256K+8K bytes. Another limitation is that NAND flash memory has a finite number of erase cycles between 10,000 and 100,000, after which the flash wears out and becomes unreliable.

Comparing MLC flash with SLC flash, MLC flash memory has advantages and disadvantages in consumer applications. In the cell technology, SLC flash stores a single bit of data per cell, whereas MLC flash stores two or more bits of data per cell. MLC flash can have twice or more the density of SLC flash with the same technology. But the performance, reliability and durability may decrease for MLC flash.

MLC flash has a higher storage density and is thus better for storing long sequences of data; yet the reliability of MLC is less than that of SLC flash. Data that is changed more frequently is better stored in SLC flash, since SLC is more reliable and rapidly-changing data is more likely to be critical data than slowly changing data. Also, smaller units of data may more easily be aggregated together into SLC than MLC, since SLC often has fewer restrictions on write sequences than does MLC.

A consumer may desire a large capacity flash-memory system, perhaps as a replacement for a hard disk. A solid-state disk (SSD) made from flash-memory chips has no moving parts and is thus more reliable than a rotating disk.

Several smaller flash drives could be connected together, such as by plugging many flash drives into a USB hub that is connected to one USB port on a host, but then these flash drives appear as separate drives to the host. For example, the host's operating system may assign each flash drive its own drive letter (D:, E:, F:, etc.) rather than aggregate them together as one logical drive, with one drive letter. A similar problem could occur with other bus protocols, such as Serial AT-Attachment (SATA), integrated device electronics (IDE), Serial small-computer system interface (SCSI) (SAS) bus, a fiber-channel bus, and Peripheral Components Interconnect Express (PCIe). The parent application, now U.S. Pat. No. 7,103,684, describes a single-chip controller that connects to several flash-memory mass-storage blocks.

Larger flash systems may use multiple channels to allow parallel access, improving performance. A wear-leveling algorithm allows the memory controller to remap logical addresses to any different physical addresses so that data writes can be evenly distributed. Thus the wear-leveling algorithm extends the endurance of the flash memory, especially MLC-type flash memory.

Multi-channel flash systems may have several channels that data is striped across. While such data striping can improve performance since multiple channels may be written at the same time, some storage area may be lost due to truncation where the storage capacity of all channels is set to match the capacity of the smallest channel. As the flash memory system wears, more bad blocks appear, reducing the available storage capacity. Since these bad blocks may appear at random locations, the channels may diverge in capacity over time. When channels have widely differing available capacities, much space is wasted in the larger channels.

What is desired is a multi-channel flash system that recovers or salvages wasted space due to truncation for cases of non-redundancy architectures. A mapping structure is desirable to map logical addresses to physical blocks in the flash memory. Portions of the extra space can be used as extra capacity. Extra space then can be used as replacement capacity for other drive with too many bad blocks.

BRIEF DESCRIPTION OF THE DRAWINGS

FIG. 2 highlights 2-level ECC in a multi-level controller architecture flash system.

FIG. 3 shows a quad-channel smart storage switch with more details of the smart storage transaction manager.

FIGS. 4A-E highlight bad block management at two levels in the multi-level controller architecture flash system.

DETAILED DESCRIPTION

The present invention relates to an improvement in Multi-Level Flash Memory Systems. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
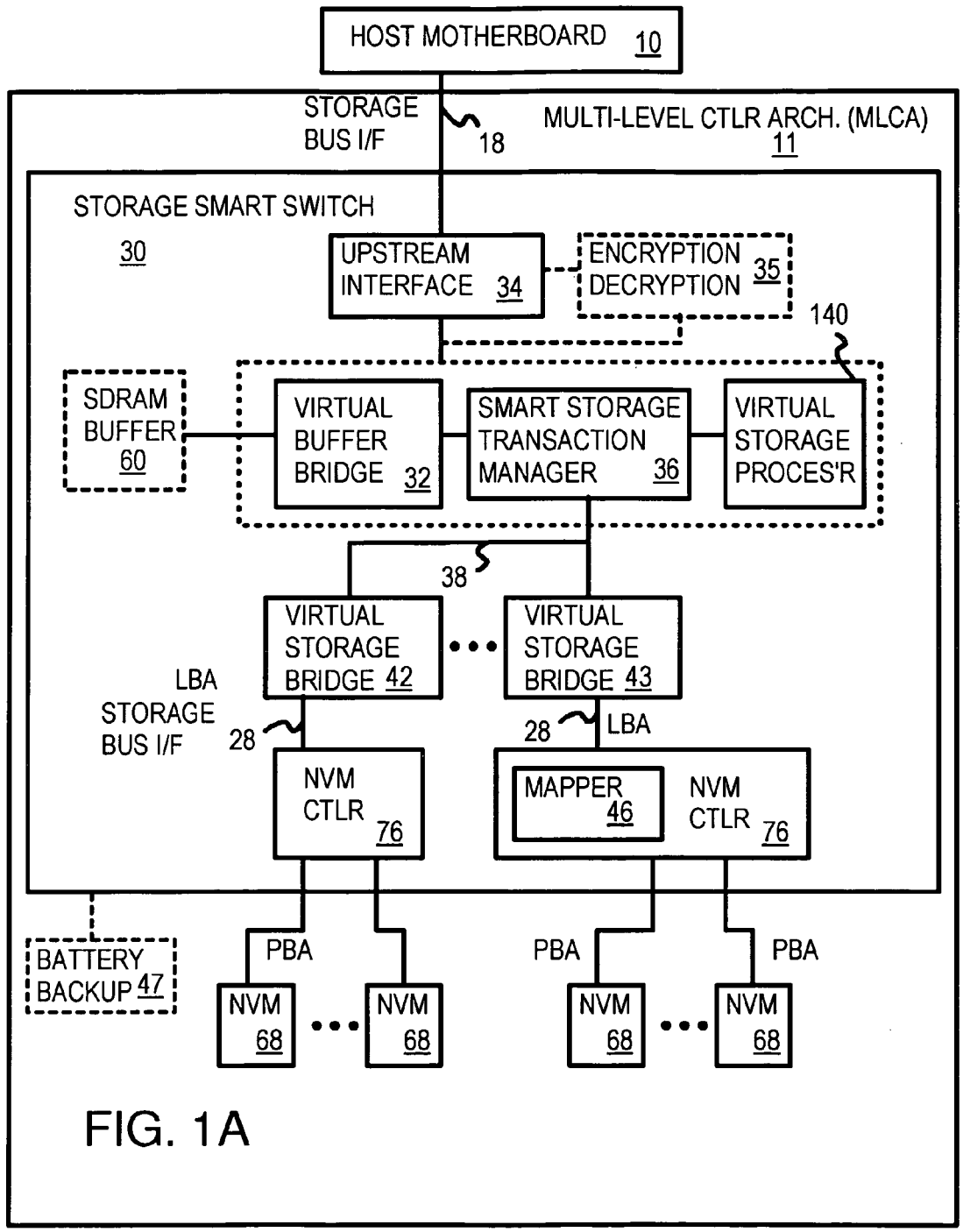
FIG. 1A shows a smart storage switch using hybrid flash memory with multiple levels of integrated controllers.

FIG. 1A shows a smart storage switch using hybrid flash memory with multiple levels of integrated controllers. Smart storage switch 30 is part of multi-level controller architecture (MLCA) 11 and connects to host motherboard 10 over host storage bus 18 through upstream interface 34. Smart storage switch 30 also connects to downstream flash storage device over LBA storage bus interface 28 through virtual storage bridges 42, 43.

Virtual storage bridges 42, 43 are protocol bridges that also provide physical signaling, such as driving and receiving differential signals on any differential data lines of LBA storage bus interface 28, detecting or generating packet start or stop patterns, checking or generating checksums, and higher-level functions such as inserting or extracting device addresses and packet types and commands. The host address from host motherboard 10 contains a logical block address (LBA) that is sent over LBA storage bus interface 28, although this LBA may be stripped by smart storage switch 30 in some embodiments that perform ordering and distributing equal sized data to attached NVM flash memory 68 through NVM controller 76. NVM flash memory 68 can be ONFI or Toggle NAND.

Buffers in SDRAM 60 coupled to virtual buffer bridge 32 can store the sector data when the host writes data to a MLCA disk, and temporally hold data while the host is fetching from flash memories. SDRAM 60 is a synchronous dynamic-random-access memory for smart storage switch 30. SDRAM 60 also can be used as temporary data storage or a cache for performing Write-Back, Write-Thru, or Read-Ahead Caching.

Virtual storage processor 140 provides striping services to smart storage transaction manager 36. For example, logical addresses from the host can be calculated and translated into logical block addresses (LBA) that are sent over LBA storage bus interface 28 to NVM flash memory 68 controlled by NVM controllers 76. Host data may be alternately assigned to flash memory in an interleaved fashion by virtual storage processor 140 or by smart storage transaction manager 36. NVM controller 76 may then perform a lower-level interleaving among NVM flash memory 68. Thus interleaving may be performed on two levels, both at a higher level by smart storage transaction manager 36 among two or more NVM controllers 76, and by each NVM controller 76 among NVM flash memory 68.

NVM controller 76 performs logical-to-physical remapping as part of a flash translation layer function, which converts LBA's received on LBA storage bus interface 28 to PBA's that address actual non-volatile memory blocks in NVM flash memory 68. NVM controller 76 may perform wear-leveling and bad-block remapping and other management functions at a lower level.

When operating in single-endpoint mode, smart storage transaction manager 36 not only buffers data using virtual buffer bridge 32, but can also re-order packets for transactions from the host. A transaction may have several packets, such as an initial command packet to start a memory read, a data packet from the memory device back to the host, and a handshake packet to end the transaction. Rather than have all packets for a first transaction complete before the next transaction begins, packets for the next transaction can be reordered by smart storage switch 30 and sent to NVM controller 76 before completion of the first transaction. This allows more time for memory access to occur for the next transaction. Transactions are thus overlapped by re-ordering packets.

Packets sent over LBA storage bus interface 28 are re-ordered relative to the packet order on host storage bus 18. Transaction manager 36 may overlap and interleave transactions to different NVM flash memory 68 controlled by NVM controllers 76, allowing for improved data throughput. For example, packets for several incoming host transactions are stored in SDRAM buffer 60 via virtual buffer bridge 32 or an associated buffer (not shown). Transaction manager 36 examines these buffered transactions and packets and re-orders the packets before sending them over internal bus 38 to virtual storage bridge 42, 43, then to one of the downstream flash storage blocks via NVM controllers 76.

A packet to begin a memory read of a flash block through bridge 43 may be re-ordered ahead of a packet ending a read of another flash block through bridge 42 to allow access to begin earlier for the second flash block.

Encryption and decryption of data may be performed by encryptor/decryptor 35 for data passing over host storage bus 18. Upstream interface 34 may be configured to divert data streams through encryptor/decryptor 35, which can be controlled by a software or hardware switch to enable or disable the function. This function can be an Advanced Encryption Standard (AES), IEEE 1667 standard, etc, which will authenticate the transient storage devices with the host system either through hardware or software programming. The methodology can be referenced to U.S. application Ser. No. 11/924, 448, filed Oct. 25, 2007. Battery backup 47 can provide power to smart storage switch 30 when the primary power fails, allowing write data to be stored into flash. Thus a write-back caching scheme may be used with battery backup 47 rather than only a write-through scheme.

Mapper 46 in NVM controller 76 performs one level of mapping to NVM flash memory 68 that are MLC flash, or two levels of mapping to NVM flash memory 68 that are SLC or MLC flash. NVM controller 76 is embedded with storage smart switch 30.

Figure 1B:
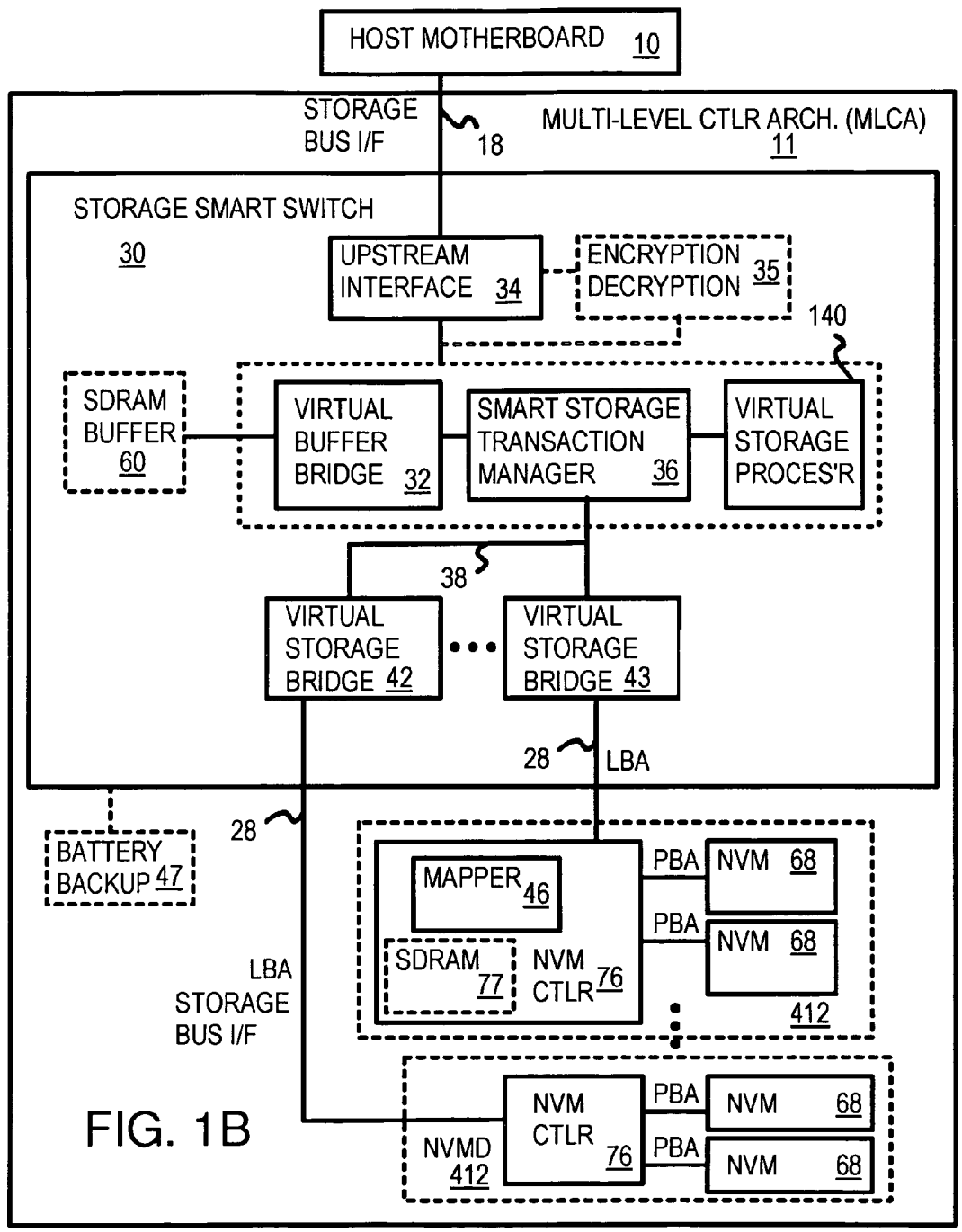
FIG. 1B shows a smart storage switch using hybrid flash memory with multiple levels of controllers and external NVMD.

FIG. 1B shows a smart storage switch using hybrid flash memory with multiple levels of controllers and external NVMD. Smart storage switch 30 is part of multi-level controller architecture (MLCA) 11 and connects to host motherboard 10 over host storage bus 18 through upstream interface 34. Smart storage switch 30 also connects to downstream flash storage device over LBA storage bus interface 28 through virtual storage bridges 42, 43.

Virtual storage bridges 42, 43 are protocol bridges that also provide physical signaling, such as driving and receiving differential signals on any differential data lines of LBA storage bus interface 28, detecting or generating packet start or stop patterns, checking or generating checksums, and higher-level functions such as inserting or extracting device addresses and packet types and commands. The host address from host motherboard 10 contains a logical block address (LBA) that is sent over LBA storage bus interface 28, although this LBA may be stripped by smart storage switch 30 in some embodiments that perform ordering and distributing equal sized data to attached NVM flash memory 68 through NVM controller 76.

Buffers in SDRAM 60 coupled to virtual buffer bridge 32 can store the sector data when the host writes data to a MLCA disk, and temporally hold data while the host is fetching from flash memories. SDRAM 60 is a synchronous dynamic-random-access memory for smart storage switch 30. SDRAM 60 also can be used as temporary data storage or a cache for performing Write-Back, Write-Thru, or Read-Ahead Caching.

Virtual storage processor 140 provides striping services to smart storage transaction manager 36. For example, logical addresses from the host can be calculated and translated into logical block addresses (LBA) that are sent over LBA storage bus interface 28 to NVM flash memory 68 controlled by NVM controllers 76. Host data may be alternately assigned to flash memory in an interleaved fashion by virtual storage processor 140 or by smart storage transaction manager 36. NVM controller 76 may then perform a lower-level interleaving among NVM flash memory 68. Thus interleaving may be performed on two levels, both at a higher level by smart storage transaction manager 36 among two or more NVM controllers 76, and by each NVM controller 76 among NVM flash memory 68.

NVM controller 76 performs logical-to-physical remapping as part of a flash translation layer function, which converts LBA's received on LBA storage bus interface 28 to PBA's that address actual non-volatile memory blocks in NVM flash memory 68. NVM controller 76 may perform wear-leveling and bad-block remapping and other management functions at a lower level.

When operating in single-endpoint mode, smart storage transaction manager 36 not only buffers data using virtual buffer bridge 32, but can also re-order packets for transactions from the host. A transaction may have several packets, such as an initial command packet to start a memory read, a data packet from the memory device back to the host, and a handshake packet to end the transaction. Rather than have all packets for a first transaction complete before the next transaction begins, packets for the next transaction can be re-ordered by smart storage switch 30 and sent to NVM controller 76 before completion of the first transaction. This allows more time for memory access to occur for the next transaction. Transactions are thus overlapped by re-ordering packets.

Packets sent over LBA storage bus interface 28 are re-ordered relative to the packet order on host storage bus 18. Transaction manager 36 may overlap and interleave transactions to different NVM flash memory 68 controlled by NVM controllers 76, allowing for improved data throughput. For example, packets for several incoming host transactions are stored in SDRAM buffer 60 via virtual buffer bridge 32 or an associated buffer (not shown). Transaction manager 36 examines these buffered transactions and packets and re-orders the packets before sending them over internal bus 38 to virtual storage bridge 42, 43, then to one of the downstream flash storage blocks via NVM controllers 76.

A packet to begin a memory read of a flash block through bridge 43 may be re-ordered ahead of a packet ending a read of another flash block through bridge 42 to allow access to begin earlier for the second flash block.

Encryption and decryption of data may be performed by encryptor/decryptor 35 for data passing over host storage bus 18. Upstream interface 34 may be configured to divert data streams through encryptor/decryptor 35, which can be controlled by a software or hardware switch to enable or disable the function. This function can be an Advanced Encryption Standard (AES), IEEE 1667 standard, etc, which will authenticate the transient storage devices with the host system either through hardware or software programming. The methodology can be referenced to U.S. application Ser. No. 11/924, 448, filed Oct. 25, 2007. Battery backup 47 can provide power to smart storage switch 30 when the primary power fails, allowing write data to be stored into flash. Thus a write-back caching scheme may be used with battery backup 47 rather than only a write-through scheme.

Mapper 46 in NVM controller 76 performs one level of mapping to NVM flash memory 68 that are MLC flash, or two levels of mapping to NVM flash memory 68 that are SLC or MLC flash. Data may be buffered in SDRAM 77 within NVM controller 76. NVM controller 76 and NVM flash memory 68 are part of Non-Volatile Memory Device (NVMD) 412. NVMD 412 are external to smart storage switch 30 in this embodiment.

Figure 1C:
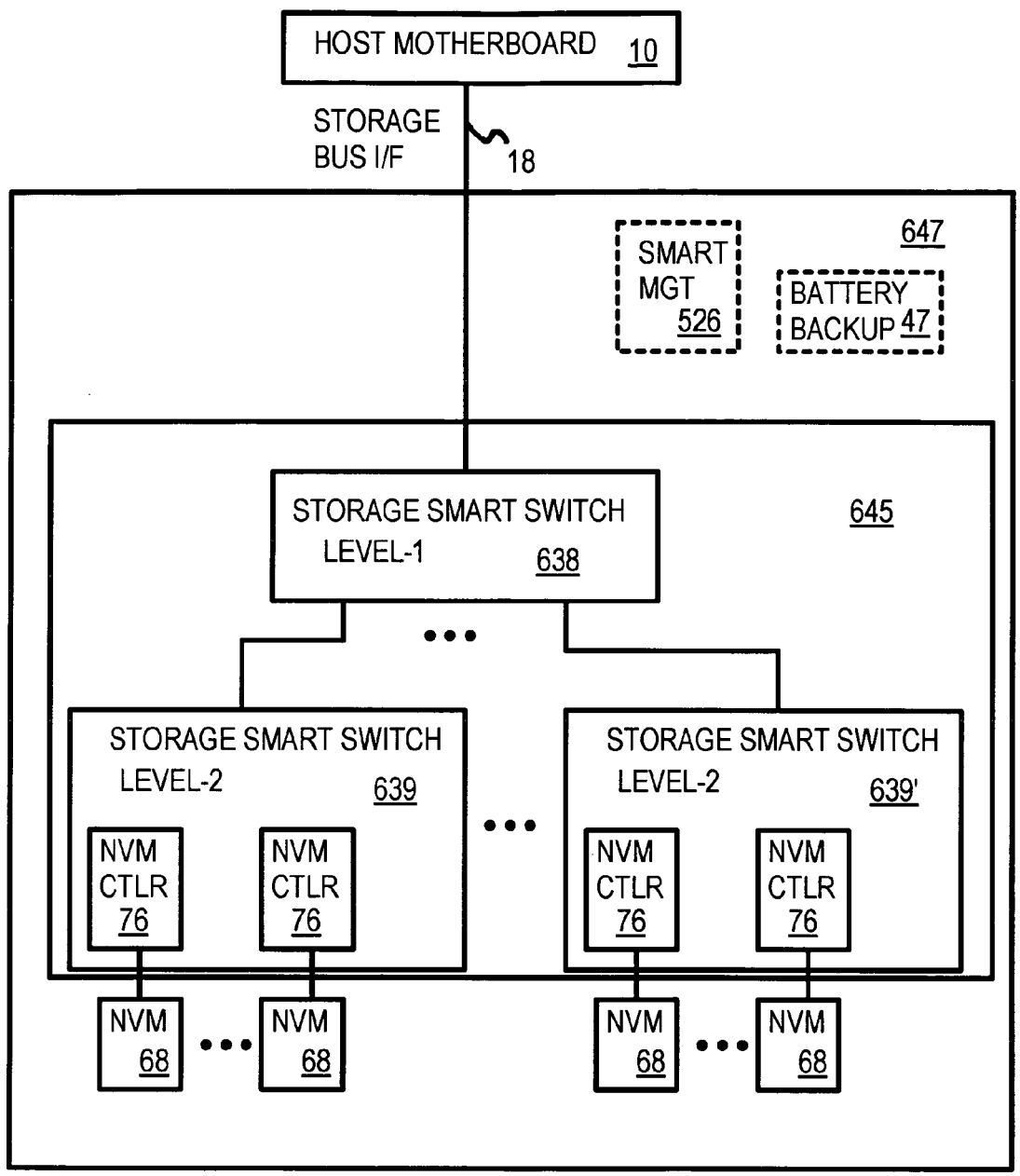
FIG. 1C shows two levels of smart storage switches using flash memory with multiple levels of integrated controllers.

FIG. 1C shows two levels of smart storage switches using flash memory with multiple levels of integrated controllers. First-level smart storage switch 638 is part of multi-level controller architecture (MLCA) and connects to host motherboard 10 over host storage bus 18. First-level smart storage switch 638 is connected to multiple second-level mart storage switches 639, 639.

Second-level smart storage switches 639, 639' connect to downstream flash storage using NVM controllers 76 that connect to NVM flash memory 68. Battery backup 47 can provide power to smart storage switches and other components in storage system 645 when the primary power fails, allowing write data to be stored into flash. Thus a write-back caching scheme may be used with battery backup 47 rather than only a write-through scheme. Remapping can be performed at a high level using optional smart manager 526 in external SSD system 647.

First-level smart storage switch 638 is used to interface to host 10 and connect to multiple second-level smart storage switches 639, 639'. Second-level smart storage switches 639, 639' further connect to multiple NVMDs as shown in FIGS. 1A and 1B. The ECC parity on all smart storage switches 638, 639, 639' can be turned on or off by selection of the user. In one embodiment, first-level smart storage switch 638 ECC parity is turned on and all smart storage switches 639, 639' have their ECC turned off. In another embodiment, first-level smart storage switch 638 has its ECC parity is turned off and all second-level smart storage switches 639, 639' have their ECC logic turned on. Cascading smart storage switches 638, 639, 639' can make the controllers less complicated.

Figure 1D:
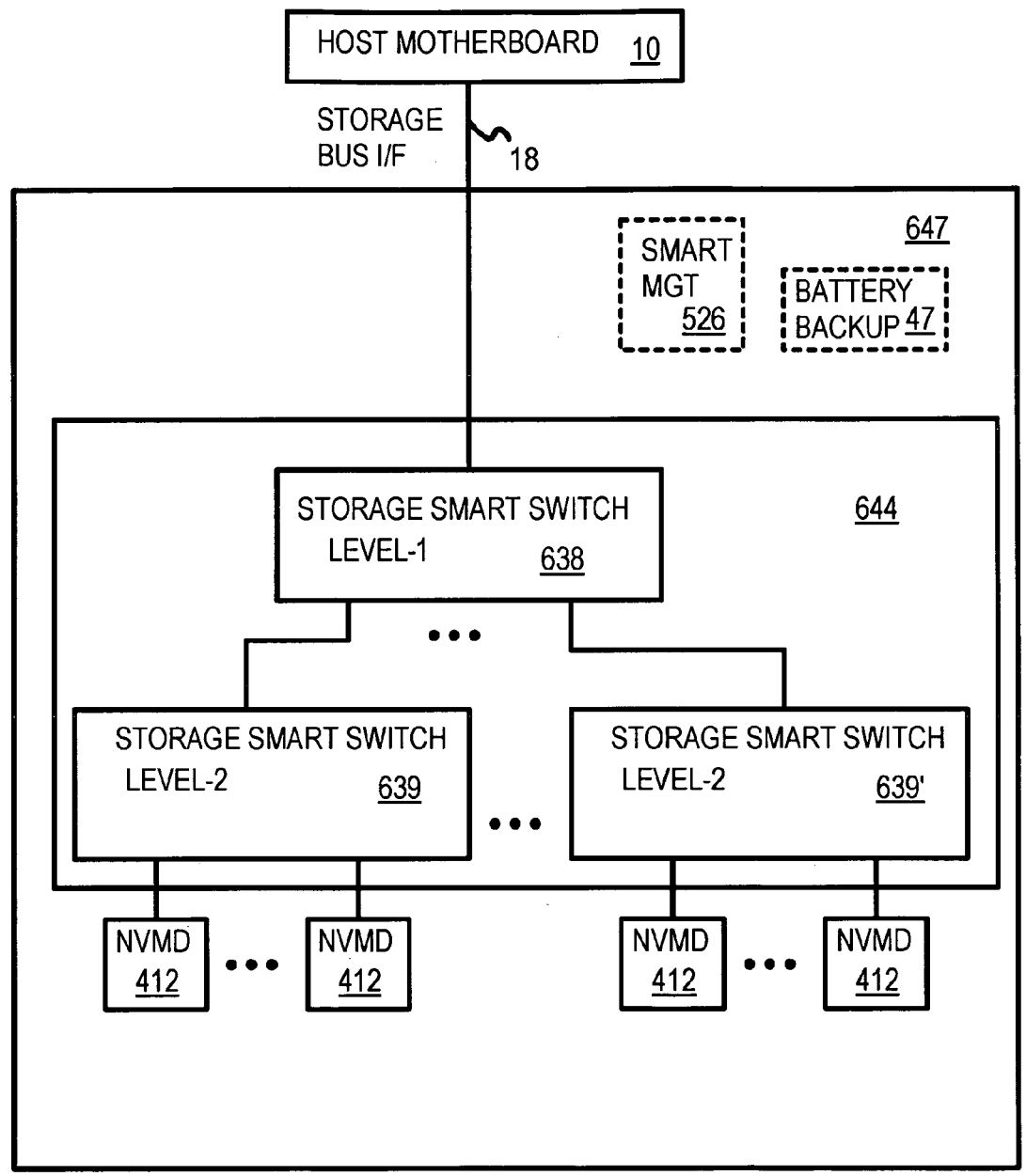
FIG. 1D shows two levels of smart storage switches controlling Non-Volatile Memory Devices (NVMD).

FIG. 1D shows two levels of smart storage switches controlling Non-Volatile Memory Devices (NVMD). First-level smart storage switch 638 is part of multi-level controller architecture (MLCA) and connects to host motherboard 10 over host storage bus 18. First-level smart storage switch 638 is connected to multiple second-level mart storage switches 639, 639.

Second-level mart storage switches 639, 639' connect to downstream Non-Volatile Memory Devices (NVMD) 412. Battery backup 47 can provide power to smart storage switches and other components in dual-level smart storage switch 644 when the primary power fails, allowing write data to be stored into flash. Thus a write-back caching scheme may be used with battery backup 47 rather than only a write-through scheme. Remapping can be performed at a high level using optional smart manager 526 in external SSD system 647.

In Multi-level flash memory architectures with more controllers involved in lower-level NVMD devices as shown in FIG. 1, flash memory capacity is actually increased since more independent address systems are used by individual lower-level mapping table adopted. Bad block amplification effect happening in one NVMD can be reduced to influence other NVM memory, which might have different locations of bad blocks occurring in transactions.

2-Level ECC Management—FIG. 2

FIG. 2 highlights 2-level ECC in a multi-level controller architecture flash system. Host commands and data are received by host protocol interface 521 and are checked by cyclical-redundancy-check (CRC) checker 523 for a first level of error correction. When an error is detected by CRC checker 523, the host is requested to retransmit the data. This protocol CRC is separate from error-correction code (ECC) described below.

Reservation unit 525 reserves one of the flash channels for use as stripe ECC storage. In this example, the fourth channel (chan 4) of NVM flash memory 68 is reserved for stripe ECC. The other 3 channels are used for stripe data. Stripe mapper 527 dispatches data to the first three channels as a stripe, and generates an ECC word from the data sent to these three channels. The generated ECC word is sent to the fourth channel for storage as the stripe's ECC.

The data sent to each of the four channels is processed by page-based ECC generators 47 in each channel to generate page-based ECC. This page-based ECC is stored with the data in each channel by flash controller 42. Both page ECC and data is stored in NVM flash memory 68 of channels 1-3, while the stripe ECC and a page ECC of the stripe ECC is stored in NVM flash memory 68 of the fourth channel. The process is repeated for additional host data or for data that is longer than one stripe.

FIG. 3 shows a quad-channel smart storage switch with more details of the smart storage transaction manager. Virtual storage processor 140, virtual buffer bridge 32 to SDRAM buffer 60, and upstream interface 34 to the host all connect to smart storage transaction manager 36 and operate as described earlier for FIG. 1A.

Four channels to four NVMD 950-953 are provided by four of virtual storage bridges 42 that connect to multi-channel interleave routing logic 534 in smart storage transaction manager 36. Host data can be interleaved among the four channels and four NVMD 950-953 by routing logic 534 to improve performance.

Host data from upstream interface 34 is re-ordered by reordering unit 516 in smart storage transaction manager 36. For example, host packets may be processed in different orders than received, such as shown later in command queue packet re-ordering FIGS. 9A-C. This is a very high-level of re-ordering. First level mapping logic 517 in smart storage transaction manager 36 performs a high level of mapping to NVMD 412.

It is useful for non-redundancy architectures to increase the total capacity by including truncated portions of NVMD 412 into the total capacity. In another embodiment, in case of one of NVMD 412 has too many bad blocks accumulated and its total capacity is not enough for it to function normally, some of its capacity can be remapped to other NVMD 412 with extra resources.

Striping logic 518 can divide the host data into stripes that are written to different physical devices, such as for a Redundant Array of Inexpensive Disks (RAID). Parity and ECC data can be added and checked by ECC logic 520, while NVMD installer 521 can install a new storage logical volume of an NVMD and then restore the bad blocks and replaced the NVMD's contents with the new NVMD by using the Parity NVMD and all other good NVMDs. The NVMD logical volumes can be assigned to different physical flash devices, such as shown in this Fig. for NVMD 950-953, which are assigned NVMD#1, #2, #3, #4, respectively.

Virtualization unit 514 virtualizes the host logical addresses and concatenates the flash memory in NVMD 950-953 together as one single unit for efficient data handling such as by remapping and error handling. Remapping can be performed at a high level by smart storage transaction manager 36 using smart manager 526, which monitor wear and bad block levels in each of NVMD 950-953. This high-level or presidential wear leveling can direct new blocks to the least-worn of NVMD 950-953, such as NVMD 952, which has a wear of 250, which is lower than wears of 500, 400, and 300 on other NVMD. Then NVMD 952 can perform additional low-level or governor-level wear-leveling among NVM flash memory 68 (FIG. 1) within NVMD 952.

Thus the high-level "presidential" wear-leveling determines the least-worn volume or NVMD, while the selected device performs lower-level or "governor" wear-leveling among flash memory blocks within the selected NVMD. Using such presidential-governor wear-leveling, overall wear can be improved and optimized.

Endpoint and hub mode logic 528 causes smart storage transaction manager 36 to perform aggregation of endpoints for switch mode as described earlier for mode logic 26 of FIG. 1. Rather than use wear indicators, the percent of bad blocks can be used by smart storage transaction manager 36 to decide which of NVMD 950-953 to assign a new block to. NVMD with a large percent of bad blocks can be skipped over. Small amounts of host data that do not need to be interleaved can use the less-worn NVMD, while larger amounts of host data can be interleaved among all four NVMD, including the more worn devices. Wear is still reduced, while interleaving is still used to improve performance for larger multi-block data transfers.

2-Level Bad Block Management—FIG. 4

Figure 4A:
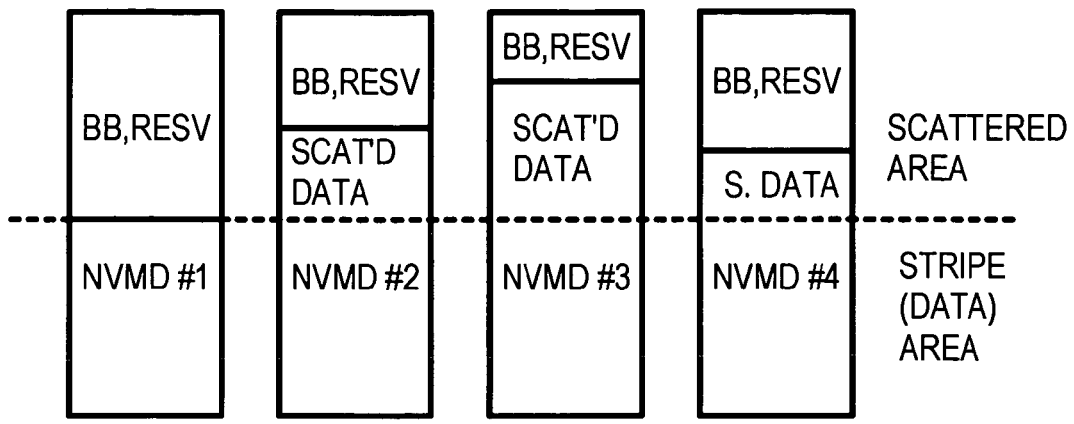

FIGS. 4A-E highlight bad block management at two levels in the multi-level controller architecture flash system for non-redundant architectures. In FIG. 4A, four channels of NVMD are show. Each channel has a different available storage capacity in this example, with NVMD#3 having the largest capacity and NVMD#1 having the smallest. Some of the available capacity is allocated for mapping tables, bad-blocks, and other system management purposes and is shown as the top area in each NVMD. The remaining area may be used for storing host data. However, when the host data is striped and sent to all four NVMD, the striped data area is limited to the remaining area of the smallest-capacity NVMD. Thus the stripe data area for all four NVMD is set to that of the smallest-capacity NVMD#1. This process of matching storage capacity of all channels of NVMD is known as truncation. This truncated data area is shown by the dashed line. Truncation is determined by the NVMD with the smallest available capacity.

The area below the dashed line is the striped data area. Fast host writes are performed in this area, since data can be dispatched to all four NVMD, and then each NVMD buffers the data and writes to its own NVM flash memory without delaying the other NVMD.

The area above the dashed line is the reserved area for smallest-capacity NVMD#1, but for other NVMD (#2, #3, #4), there is an additional area that is not needed for system management. The inventors use this additional area to store scattered data. Scattered data is data that is not accessible as a stripe. Instead, the scattered data is accessed by individually accessing one NVMD at a time. Since parallel access of many NVMD is blocked when accessing scattered data, the access times and performance are lower than for striped data access.

The scattered area above the dashed line includes both system management or reserved data and information, and scattered data. Over time, the number of bad blocks increase, and the reserved (RESV) area may not have enough empty blocks. This can slow down one of the NVMD. Relocating some portions of the NVMD to other NVMD with more capacity can prolong the system's total lifetime. Scattered data may include bad blocks that are re-mapped from one NVMD to another NVMD. Thus the otherwise wasted space in other NVMD (#2, #3, #4) is useful for scattered data storage despite truncation. The stripe or data area can have a fast read/write with optional ECC data redundancy protection. The LBA can sequence from 0 to the end of the stripe. The LBA of the scattered data area is larger than the end-of-stripe LBA.

Figure 4B:
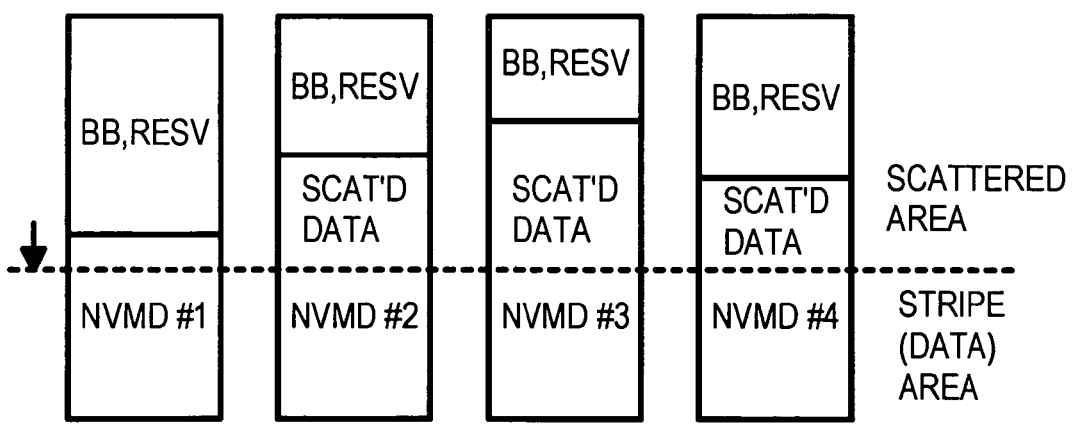

In FIG. 4B, the stripe data area is purposely lower than for FIG. 4A due to a more conservative and flexible configuration. The reserved area in each NVMD increases to provide larger mapping tables for the additional bad blocks. However, the scattered area increases. Scattered data may be stored in the area above the dashed line in the NVMD. The stripe data area can be smaller than the smallest capacity.

The stripe data area is set lower at the beginning of system setup so that the scattered data area can be allocated for the end portion of each NVMD. Larger LBA numbers can be remapped to different NVMD. The stripe area starts with LBA 0 and runs to the size of the stripe data area. LBA's for the scattered data area are after the stripe data area to the end of each NVMD's capacity.

Figure 4C:
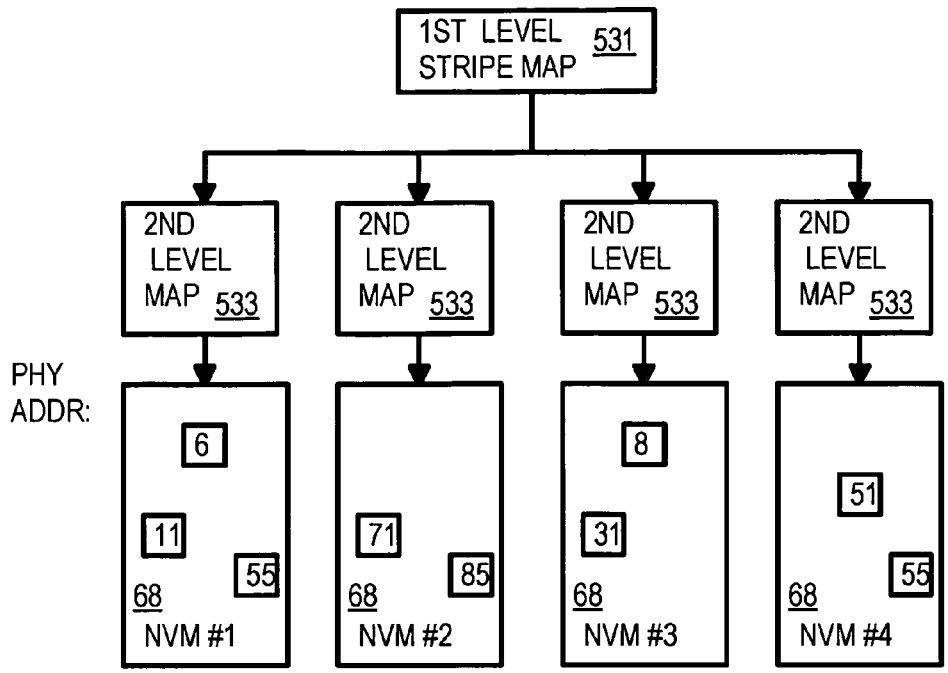

FIG. 4C shows two levels of mapping tables. First-level striping map 531 is managed by smart storage switch 30 and provides an overall allocation between the scattered area and the striped data area for all four channels of NVMD. Incoming host data that is not striped can be written as scattered data to a channel with excess capacity. For example, smaller data writes could be allocated to a larger NVMD with a large scattered data area by first-level striping map 531.

Each NVMD has second level map 533 which remaps bad blocks in NVM flash memory 68 within that NVMD. FIG. 4C shows that bad blocks are located in random locations within the physical address space of NVM flash memory 68.

Figure 4D:
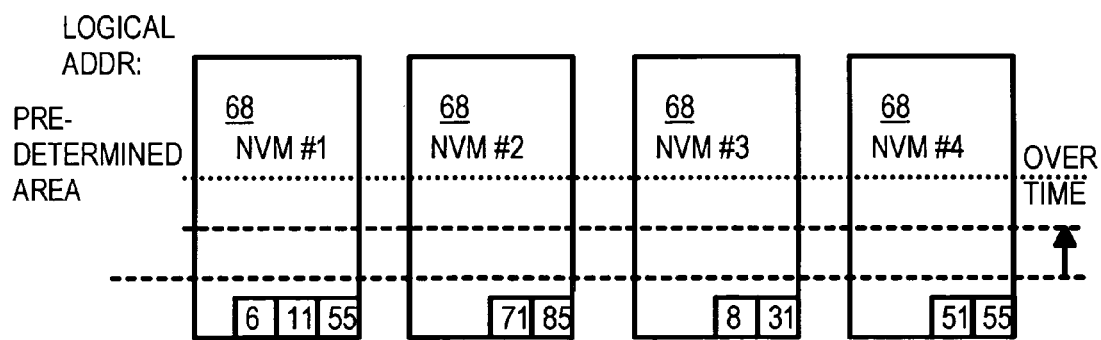

FIG. 4D shows remapping of bad blocks in the logical address space of each channel. Each NVMD has its second level map 533 loaded with locations of bad blocks in that channel's NVM flash memory 68. These bad blocks are removed from the striped domain of logical addresses that receives striped data. The bad blocks are moved in the logical address space into the scattered domain. Over time, as the system wears out and more bad blocks are discovered, the scattered domain increases in size and the striped domain decreases in size. Scattered data from smart storage switch 30 that is mapped by first-level striping map 531 to the scattered domain of an NVMD is stored in the scattered domain and located by second level map 533.

FIG. 4E shows first- and second-level maps in more detail. First-level striping map 531 stores the overall capacity of each NVMD, and divides this capacity into a striped capacity and a scattered capacity that includes a reserved area and a swap area. The swap area is for stored data for relocated bad blocks that later occur, while the reserved area stores non-data system overhead information, such as firmware for NVM controllers.

Initially, first-level striping map 531 shows that all four NVMD have been truncated to 180 blocks of striped capacity each, and the reserved area of each NVMD ranges from 2 to 5 blocks.

After some time, the increase in bad blocks has caused truncation to be repeated, with each NVMD still having 180 blocks of striped capacity. However, the reserved area in each NVMD has increased to 10-13 blocks. First-level striping map 531 also has a map of host logical addresses to the assigned NVMD, and whether that data is in the striped domain or the scattered domain of that NVMD. Thus host reads can quickly find the requested data.

Each NVMD has second level map 533 with bad block table 535 that lists the physical addresses of bad blocks in that NVMD's NVM flash memory 68. Blocks listed in bad block table 535 are not allocated to receive new host data. Other maps and tables may be present in second level map 533, such as shown later in FIGS. 7-8.

Figure 5:
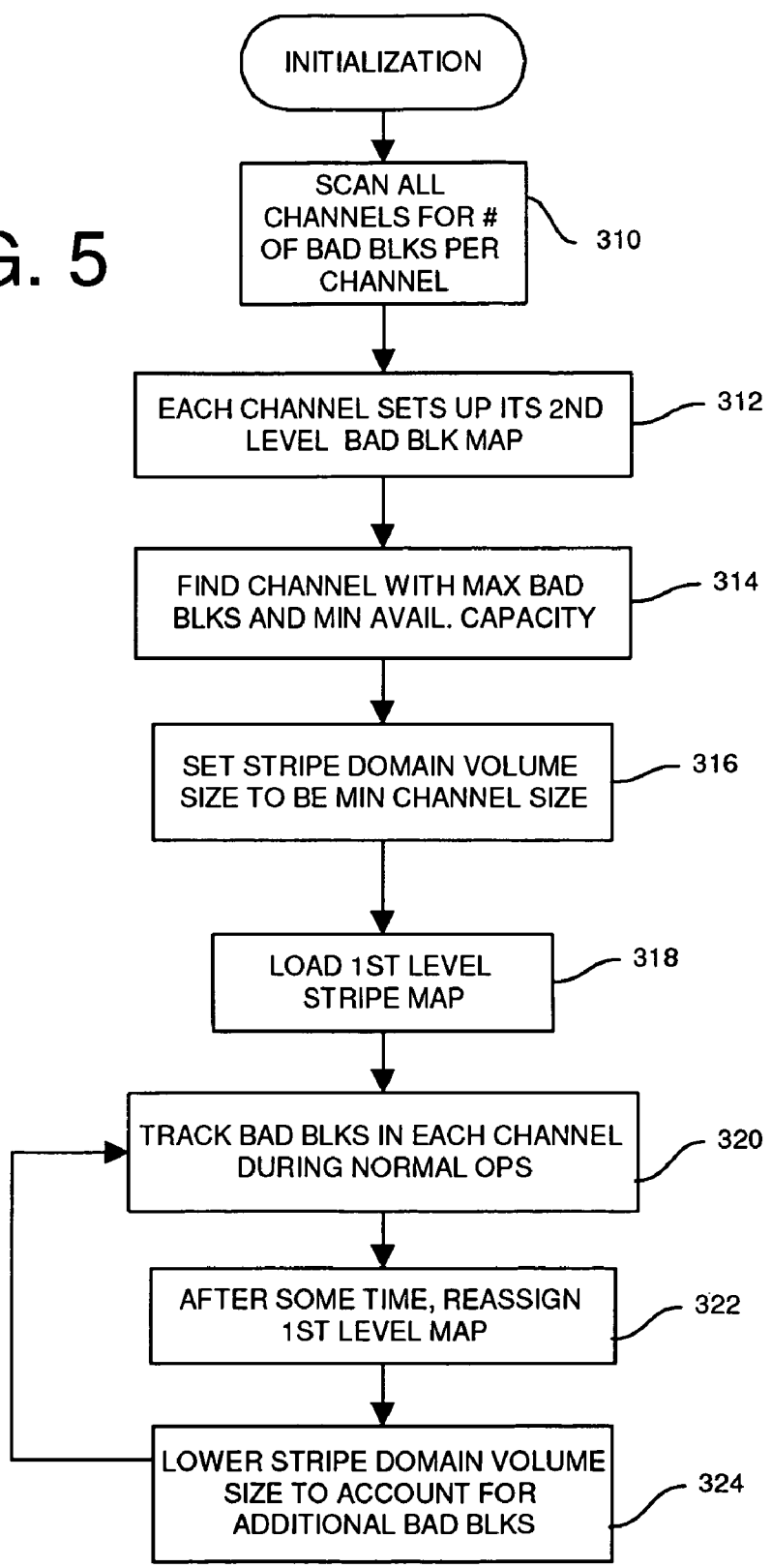
FIG. 5 is a flowchart of striped and scattered domain management in a multi-level controller architecture flash system.

FIG. 5 is a flowchart of striped and scattered domain management in a multi-level controller architecture flash system. The smart storage switch scans all channels for bad bocks by activating or polling the NVMD in each channel, step 310. Each channel's NVMD scans its NVM flash memory and sets up its second level map of bad blocks, step 312. The NVMD then reports back to the smart storage switch its available capacity and other details of its flash structure in that channel. The smart storage switch compares capacities of all channels to find the channel with the smallest available capacity, step 314. This is often the channel with the most bad blocks, such as when all channels have the same nominal capacity.

The smallest available capacity is multiplied by the number of NVMD that are not reserved for stripe ECC to generate the stripe domain volume size, step 316. All channels have their striped data size set to the size of the smallest available capacity. Any remaining capacity is set as scattered domain area that can receive scattered but not striped data. The smart storage switch loads the first-level striping map with the striped and scattered domain size generated, step 318.

Over time, new bad blocks are discovered by NVMD. These NVMD add an entry for each new band block found to their bad block table in their second level map 533 for that channel, step 320. Band blocks are initially managed by NVM controller 76 in each channel, but later smart storage switch is informed of the new number of bad blocks. Then smart storage switch re-loads its first-level striping map, step 322, using the new bad block information and lowers the striped capacity, step 324.

Figure 6:
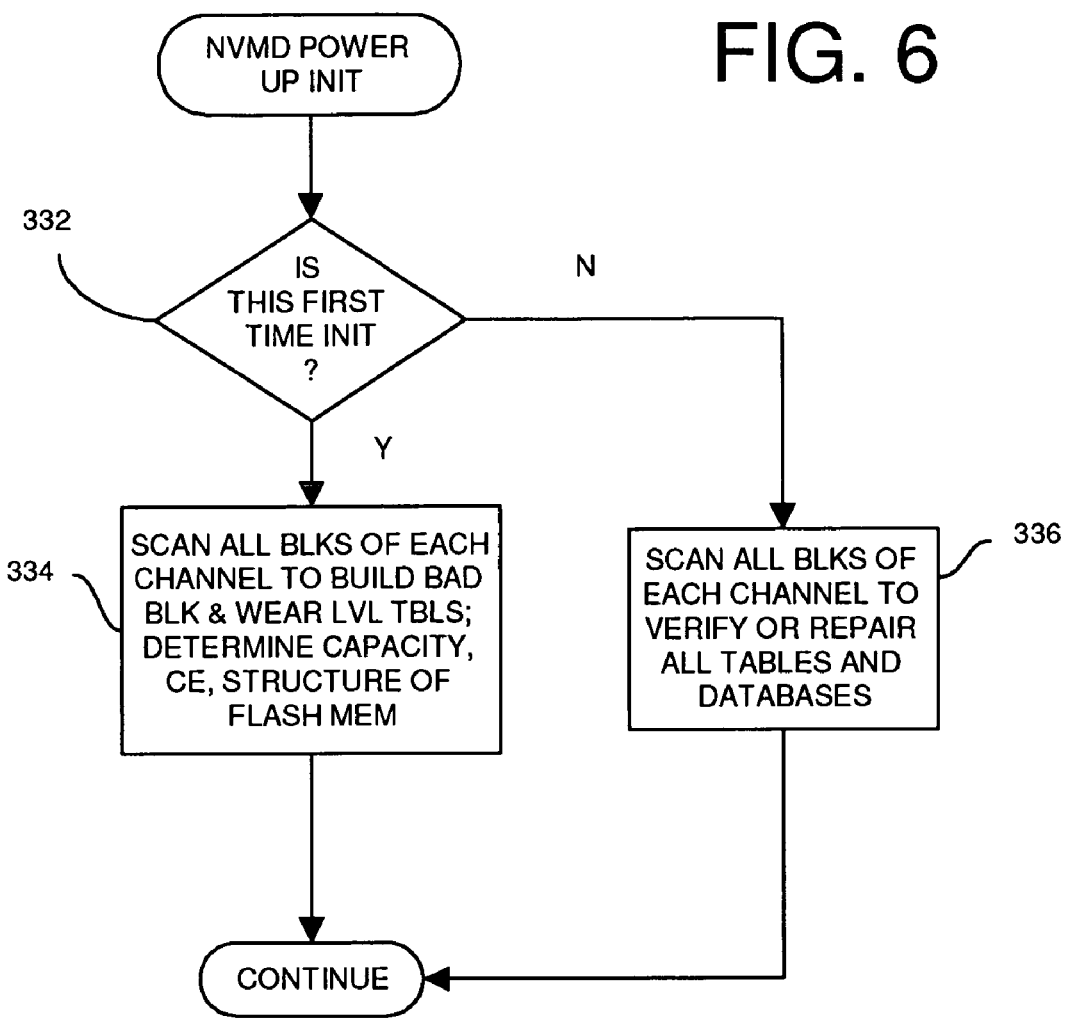
FIGS. 6, 7 are flowcharts of power-up routines.
Figure 7:
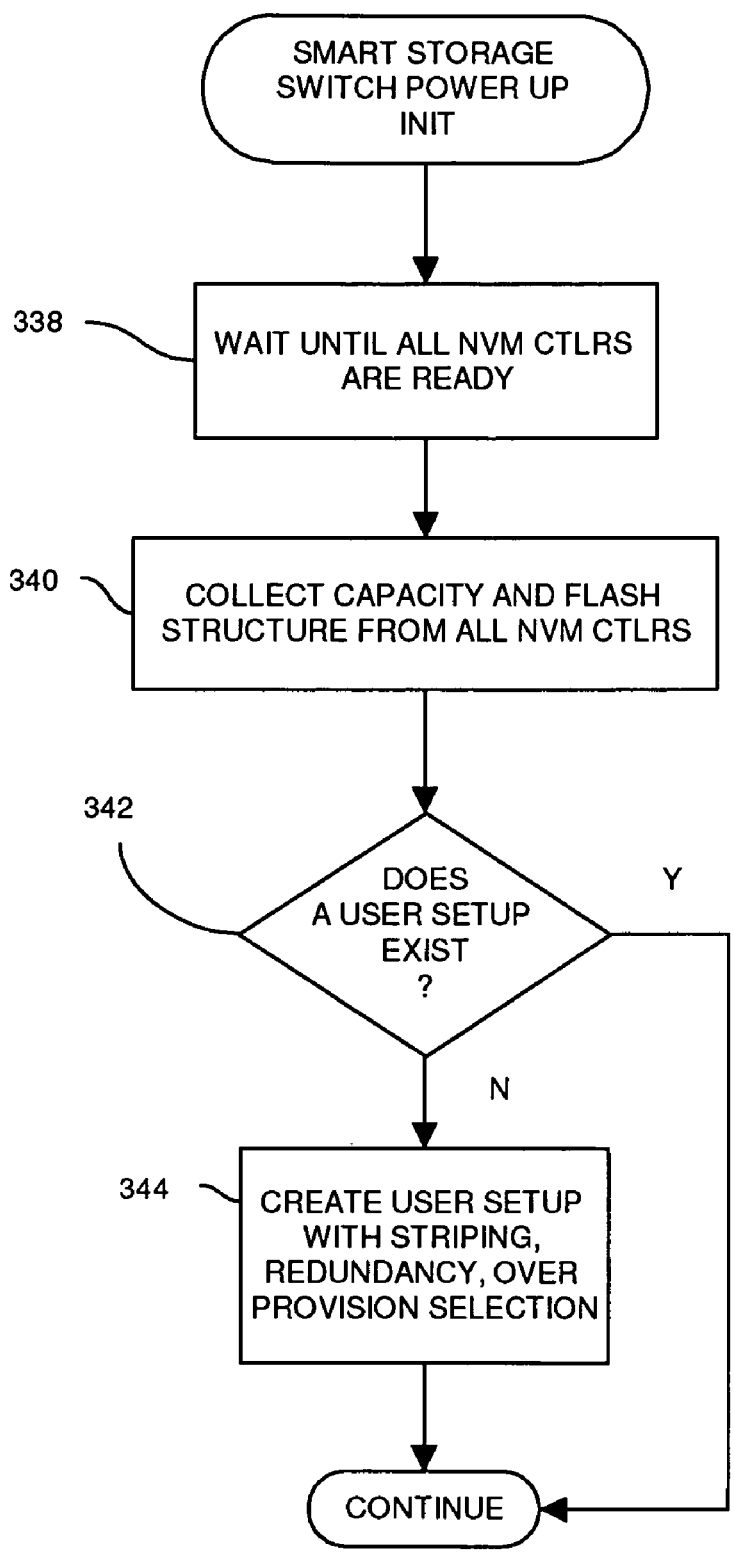

FIGS. 6, 7 are flowcharts of power-up routines. In FIG. 6, the NVMD are powered up or initialized. When this is the first time that the NVMD has been powered up, such as indicated by a flag in non-volatile firmware of the NVMD, step 332, then the NVMD scans all blocks of NVM flash memory 68 to build bad block and wear leveling tables. The capacity and structure of NVM flash memory 68 is also determined, such as the number of separate chip enables (CE's) that may be used to separately address NVM flash memory 68, step 334. This information is ready for the smart storage switch to access.

When this is not the first time that the NVMD has been powered up, such as indicated by a flag in non-volatile firmware of the NVMD, step 332, then the NVMD scans all blocks of NVM flash memory 68 to verify or repair the various tables and databases managed by the NVMD, step 336. These tables are sometimes damaged by sudden loss of power.

In FIG. 7, when the smart storage switch is powered up or initialized, this routine is activated. The smart storage switch waits until all NVMD are ready, such as by asserting a ready line to smart storage switch 30, step 338. The smart storage switch collects the capacity and flash structure from all NVMD, step 340. If a user setup already exists, step 342, then this profile is used. The user profile can include the stripe size and parity configuration. If no user profile is found, step 342, then the user or the host is polled to determine desired characteristics of the flash system, such as the degree of redundancy, striping, over-provisioning, etc. desired by the user, step 344. The smart storage switch can then use this user profile to set up first-level striping map 531 and assign NVMD from ECC or redundancy.

Figures 8, 9:
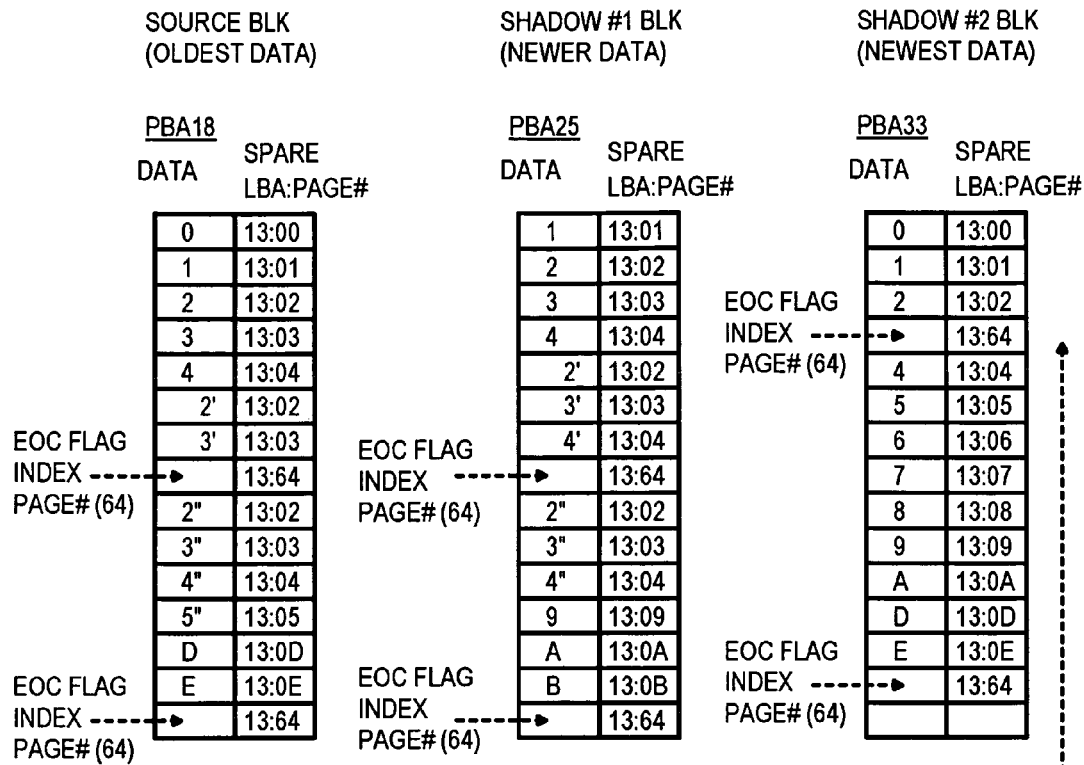
FIGS. 8, 9 highlight source and shadow blocks in a flash-memory system.

Source and Shadow Blocks—FIGS. 8-9

FIGS. 8-9 highlight source and shadow blocks in a flash-memory system.

FIG. 8 shows a source block and two shadow blocks.

A first write command to LBA 13 is arriving, and the controller maps source block PBA18. The write command with pages 0-4, then pages 2-3, then "EOC FLAG INDEX" was marked on the next empty page of the block. Later on another write command with pages 2-5, then pages D-E and the last page was marked with "EOC FLAG INDEX". The block PBA18 is full. Write command with page 1-4 is written, and the Shadow #1 Block PBA25 is created. The next write command with pages 2-4, then "EOC FLAG INDEX" is written. Later on a write command with pages 2-4 is written, then pages 9-B are written, then the last page of PBA25 is written with "EOC FLAG INDEX". The block PBA25 is now full. A new write command with pages 0-2 is received. Shadow #2 Block PBA33 is created. The "EOC FLAG INDEX" page is written. Then the last write command with pages 4-E comes in. Then the "EOC FLAG INDEX" page is written. The PBA-TO-LBA MAP will have contents 13H in the entry of 18H, 25H, and 33H. The PROPERTIES TBL will have 10H in entry 18H, 11H in entry 25H, and 12H in entry 33H. After certain period of time, the controller will inspect the three blocks related to LBA 13H, and finds that the data in PBA18 are all stale, and a valid page 3 is located in PBA25. The controller writes 00 to entry 18H of the PBA-TO-LBA MAP. Also, it changes the PROPERTIES TBL with 00 to entry 18H, 10H to entry 25H, and 11H to entry 33H.

The source block, PBA18, has the oldest host data. The host data's LBA and page offset are stored in the spare area of each page. In this example there are 64 pages (page 0 to page 63) per physical block.

As source block PBA18 fills up with host data, new host data is written into shadow #1 block PBA25. Shadow #1 block PBA25 has fresher data than source block PBA18. However, some data in the source block is still fresh.

Eventually shadow #1 block PBA25 fills up, and the new host data is stored in shadow #2 block, PBA33. The host data in the source block and shadow #1 block become more stale as fresher data is written into shadow #2 block.

The last remaining pages of fresh data in source block PBA18 can be copied to shadow #2 block PBA33 by NVMD controller 76. Once all fresh data has been copied from source block PBA18, the source block can safely be erased and recycled to the pool of available blocks for future use. Then the shadow #1 block becomes the new source block and another new block from the pool of recycled blocks is allocated to be the shadow #2 block. The old Shadow #2 block PBA33 becomes the shadow #1 block. This process of relocating data from the source block to a shadow block is repeated to improve wear leveling and performance.

In another embodiment, both the fresh data in source block PBA18 and shadow #1 block PBA25 can be copied to shadow #2 block PBA33, and both PBA18 and PBA25 can safely be erased and recycled to the pool of available blocks for future use. Shadow #2 block becomes the new source block.

When the host reads data, there may be several copies of data for the addressed sector. Only one of those copies has the freshest data. NVM controller 76 first searches physical map 575 and properties table 577 to find the locations of the source block, shadow #1 block, and shadow #2 block related to the LBA of the data the host wants to read. Then NVM controller 76 can first search shadow #2 block, then shadow #1 block, and finally the source block for the requested data.

A special flag can be inserted into the last unused page of the block once the last page has been written for each host command. The flag can be an unused page index, such as for non-existing page 64. A special page data pattern could also be used. When the host reads, it starts from shadow #2 block if it exists. It starts with last page of that block until the first non-empty page is found. If this page has a special flag marked in its spare area, the content of the page has mapping information of the logical page address mapping for the physical page address. So NVM controller 76 can proceed to access the page data directly instead of searching backwards until the sector data is found (the spare area logical page address is matched), without reading all pages in the shadow and source blocks.

In FIG. 9, a physical-to-logical mapping table is shown. Rather than map from logical to physical pages as shown for mapping table 25 of FIG. 7, a PBA-to-LBA map may be used. Physical map 575 has entries indexed by the PBA. When a LBA is loaded into a PBA, that PBA's entry is loaded with the host LBA. For example, source block PBA18, and shadow blocks PBA25 and PBA33 all receive data for LBA-13, so 13 is loaded into these three PBA entries in physical map 575.

Properties table 577 is associated with physical map 575, and stores properties of each physical block mapped in physical map 575. For example, properties table 577 stores 10 for PBA18, indicating that it is currently the source block, the next to be recycled once stale data is removed. Properties table 577 also stores 11 for PBA25, indicating that it is currently the shadow #1 block, and 12 for PBA33, indicating that it is currently the shadow #2 block.

Physical map 575 may map only a limited number of logical addresses and may need to be reloaded from a larger map stored in flash memory when the LBA does not fall within the range of entries in physical map 575. For example, physical map 575 may be limited to 50 LBA's in its 64 block entries. Before the new map is loaded into tables 575 and 577, the existing map of tables of 575 and 577 need to be written back to the corresponding area of the larger map stored in flash memory.

Flash Board Architectures—FIG. 10

Figure 10A:
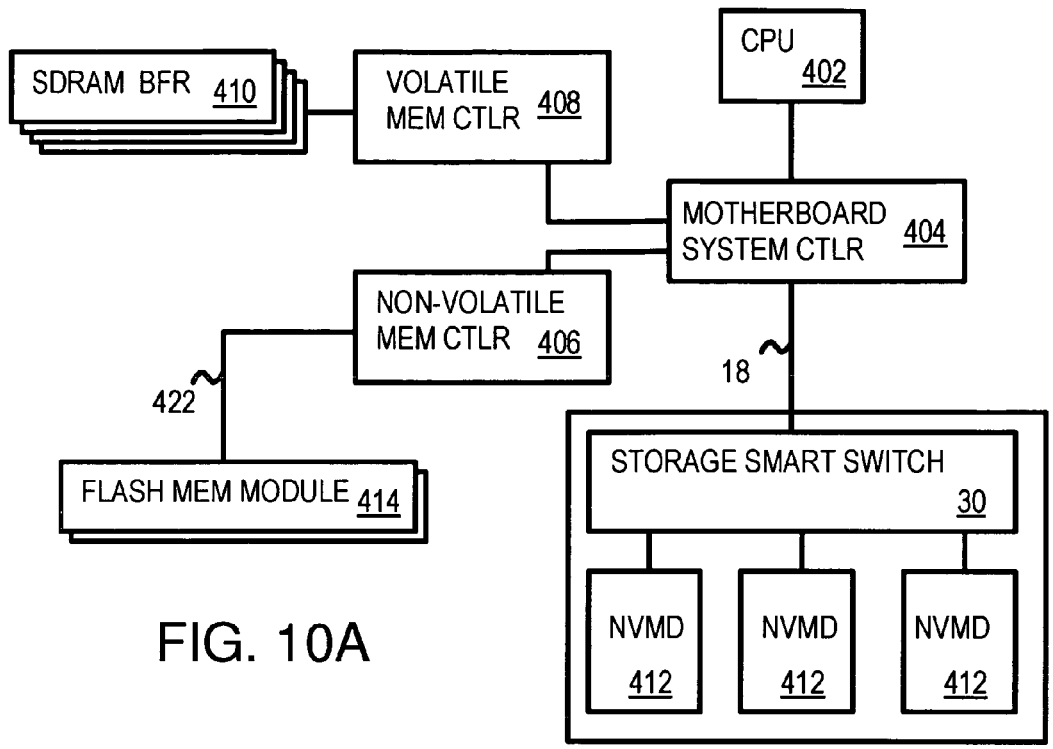
FIGS. 10A-C show boards with flash memory.
Figure 10B:
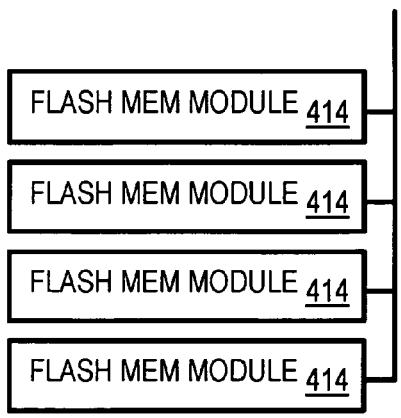
Figure 10C:
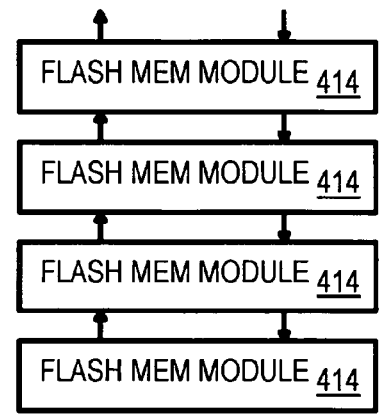

FIGS. 10A-C show boards with flash memory. These boards could be plug-in boards that fit into a slot, or could be integrated with the motherboard or with another board.

FIG. 10A shows a host system using flash modules. Motherboard system controller 404 connects to Central Processing Unit (CPU) 402 over a front-side bus or other high-speed CPU bus. CPU 402 reads and writes SDRAM buffer 410, which is controlled by volatile memory controller 408. SDRAM buffer 410 may have several memory modules of DRAM chips.

Data from flash memory may be transferred to SDRAM buffer 410 by motherboard system controller using both volatile memory controller 408 and non-volatile memory controller 406. A direct-memory access (DMA) controller may be used for these transfers, or CPU 402 may be used. Non-volatile memory controller 406 may read and write to flash memory modules 414. DMA may also access NVMD 412 which are controlled by smart storage switch 30.

NVMD 412 contains both NVM controller 76 and NVM flash memory 68 as shown in FIG. 1B. NVM controller 76 converts LBA to PBA addresses. Smart storage switch 30 sends logical LBA addresses to NVMD 412, while non-volatile memory controller 406 sends either LBA or physical PBA addresses over physical bus 422 to flash modules 414. Physical bus 422 can carry LBA or PBA depending on the type of flash modules 414. A host system may have only one type of NVM sub-system, either flash modules 414 or NVMD 412, although both types could be present in some systems.

FIG. 10B shows that flash modules 414 of FIG. 10A may be arranged in parallel on a single segment of physical bus 422. FIG. 10C shows that flash modules 414 of FIG. 10A may be arranged in series on multiple segments of physical bus 422 that form a daisy chain.

Figure 11A:
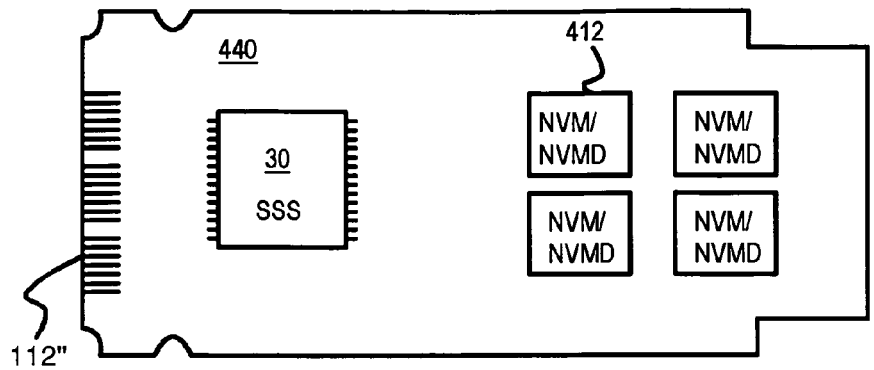
FIG. 11A shows a Solid-State-Disk (SSD) board that can connect directly to a host.

FIG. 11A shows a Solid-State-Disk (SSD) board that can connect directly to a host. SSD board 440 has a connector 112" that plugs into a host motherboard, such as into host storage bus 18 of FIG. 1. Connector 112" can carry a SATA, PATA, PCI Express, or other bus. NVMD 412 are soldered to SSD board 440 or plugged into connectors. Other logic and buffers may be present. Smart storage switch 30 is shown in FIG. 1. NVM flash memory 68 may be substituted for NVMD 412 in some embodiments.

Figure 11B:
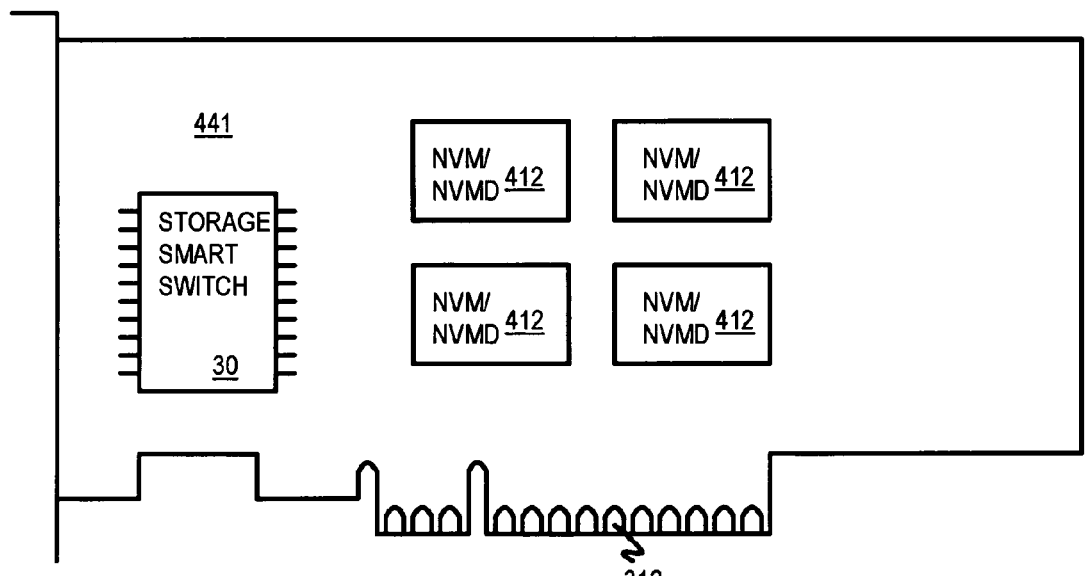
FIG. 11B shows a PCIe card with NVM flash memory.

FIG. 11B shows a PCIe card with NVM flash memory. Connector 312 on PCIe card 441 is a x1, x2, x4, or x8 PCIe connector that is plugged into a PCIe bus. Smart storage switch controller 30 may use a SDRAM to buffer data to NVMD 412. NVM flash memory 68 may be substituted for NVMD 412 in some embodiments.

Figure 11C:
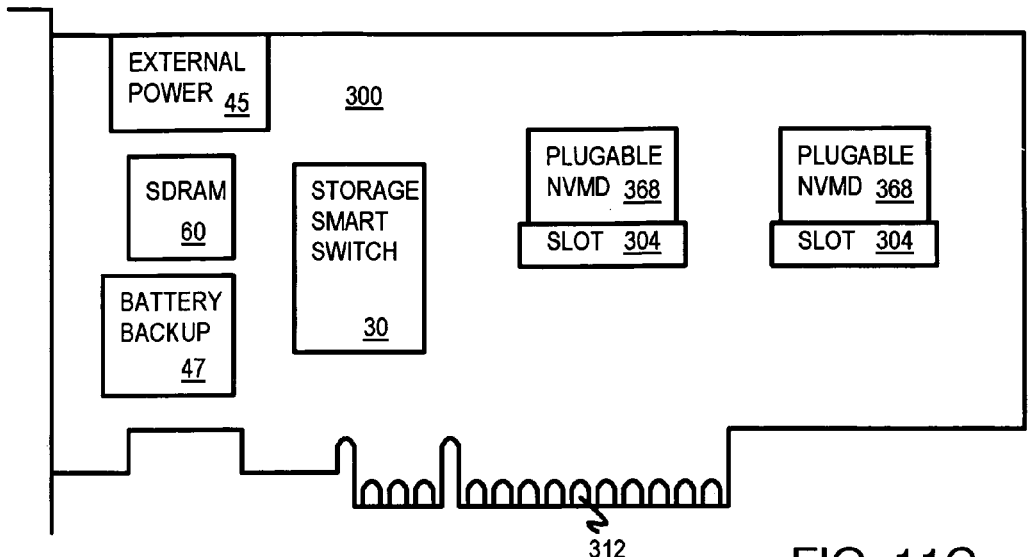
FIG. 11C shows a PCIe card with insertable NVM flash memory in slots.

FIG. 11C shows a PCIe card with insertable NVM flash memory in slots. Connector 312 on PCIe card 300 is a x1, x2, x4, x8, or x16 PCIe connector that is plugged into a PCIe bus. Smart storage switch controller 30 uses SDRAM 60 to buffer data to NVMD.

SDRAM 60 can be directly soldered to PCIe card 300 or a removable SDRAM module may be plugged into a module socket on PCIe card 300. Data is sent through smart storage switch 30 to slots 304, which have pluggable NVMD 368 inserted. Pluggable NVMD 368 may contain NVMD 412. Power for pluggable NVMD 368 is provided through slot 304.

Optional power connector 45 is located on PCIe card 300 to supply power for pluggable NVMD 368 in case of the power from the connector 312 cannot provide enough power. Battery backup 47 can be soldered in or attached to PCIe card 300 to supply power to PCIe card 300 and slots 304 in case of sudden power loss.

Figure 11D:
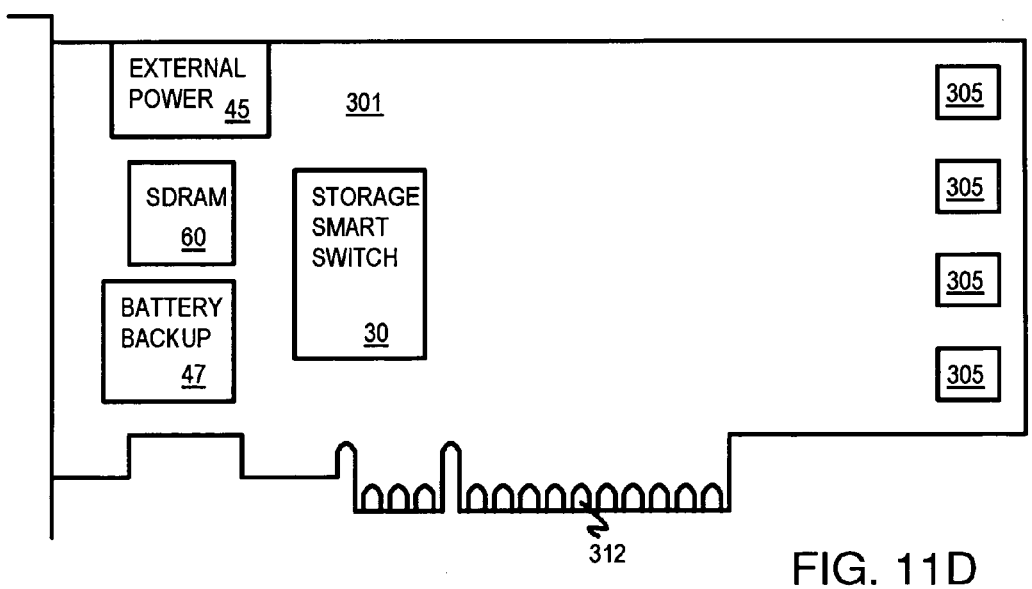
FIG. 11D shows a PCIe card with NVM flash memory connected through cables.

FIG. 11D shows a PCIe card with NVM flash memory connected through cables. Connector 312 on PCIe card 301 is a x1, x2, x4, x8. or x16 PCIe connector that is plugged into a PCIe bus. Smart storage switch controller 30 uses SDRAM 60 to buffer data to NVMD.

Data is sent through smart storage switch 30 to connectors 305, which accept a cable (not shown) that connects to external MLCA 11 (not shown). Power for cable-connected MLCA is provided through connectors 305. Connector 305 can accept a daughter card, and NVMD, or a cable to expand the flash memory capacity.

Optional power connector 45 is located on PCIe card 301 to supply power for external NVMD in case of the power from the connector 312 cannot provide enough power. Battery backup 47 can be soldered in or attached to PCIe card 301 to supply power to PCIe card 301 and connectors 305 in case of sudden power loss.

A second level of smart storage switch 30 may be added to these embodiments.

SSD Drives—FIG. 12

Figure 12A:
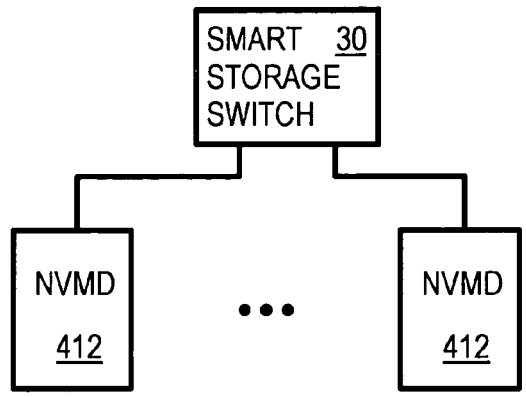
FIGS. 12A-B show a Solid-State Drive (SSD) using boards that are MLCA drives each with a smart storage switch.
Figure 12B:
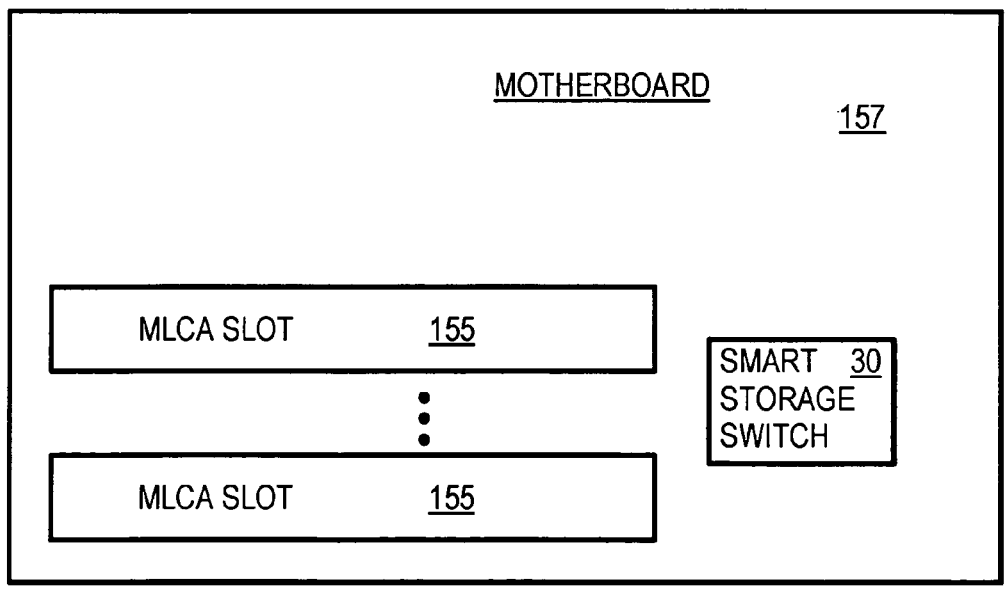

FIGS. 12A-B show a Solid-State Drive (SSD) using boards that are MLCA drives each with a smart storage switch. In FIG. 12A, smart storage switch 30 replicates data and tracks the multiple copies of data. The data is stored by several NVMD 412.

In FIG. 12B, motherboard 157 has smart storage switch 30 mounted thereon. Two or more MLCA slots 155 are connected to smart storage switch 30 by wiring traces on motherboard 157. Each MLCA slot 155 can accept one MLCA 11 of FIG. 1A-B.

Flash Modules—FIG. 13

Figure 13A:
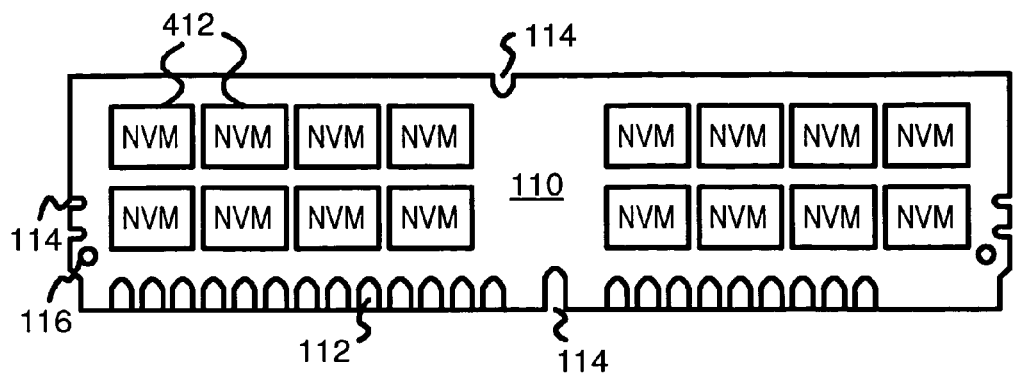
FIGS. 13A-D show flash modules that fit into sockets on a SATA storage drive board.

FIGS. 13A-D show flash modules that fit into sockets on a board such as a SATA storage drive board. FIG. 13A shows a flash module. Flash module 110 contains a substrate such as a multi-layer printed-circuit board (PCB) with surface-mounted NVMD 412 mounted to the front surface or side of the substrate, as shown, while more NVMD 412 are mounted to the back side or surface of the substrate (not shown). Alternatively, NVMD 412 can use a socket or a connector instead of being directly surface-mounted.

Metal contact pads 112 are positioned along the bottom edge of the module on both front and back surfaces. Metal contact pads 112 mate with pads on a module socket to electrically connect the module to a PC motherboard or a solid state disk card. Holes 116 are present on some kinds of modules to ensure that the module is correctly positioned in the socket. Notches 114 also ensure correct insertion and alignment of the module. Notches 114 can prevent the wrong type of module from being inserted by mistake. Capacitors or other discrete components are surface-mounted on the substrate to filter noise from NVMD 412, which are also mounted using a surface-mount-technology SMT process.

Flash module 110 connects NVMD 412 to metal contact pads 112. The connection to flash module 110 is through a logical bus LBA or through LBA storage bus interface 28. NVM flash memory 68 and NVM controller 76 of FIG. 1 could be replaced by flash module 110 of FIG. 13A.

Figure 13B:
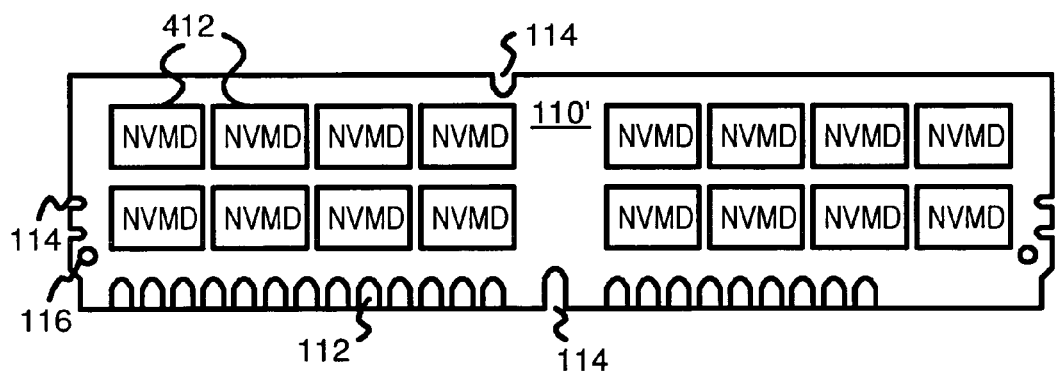

FIG. 13B shows a LBA flash module. Flash module 110' contains a substrate such as a multi-layer printed-circuit board (PCB) with surface-mounted NVMD 412 mounted to the front surface or side of the substrate, as shown, while more NVMD 412 are mounted to the back side or surface of the substrate (not shown).

Metal contact pads 112 are positioned along the bottom edge of the module on both front and back surfaces. Metal contact pads 112 mate with pads on a module socket to electrically connect the module to a PC motherboard or a solid state disk card. Holes 116 are present on some kinds of modules to ensure that the module is correctly positioned in the socket. Notches 114 also ensure correct insertion of the module. Capacitors or other discrete components are surface-mounted on the substrate to filter noise from NVMD 412.

Figure 13C:
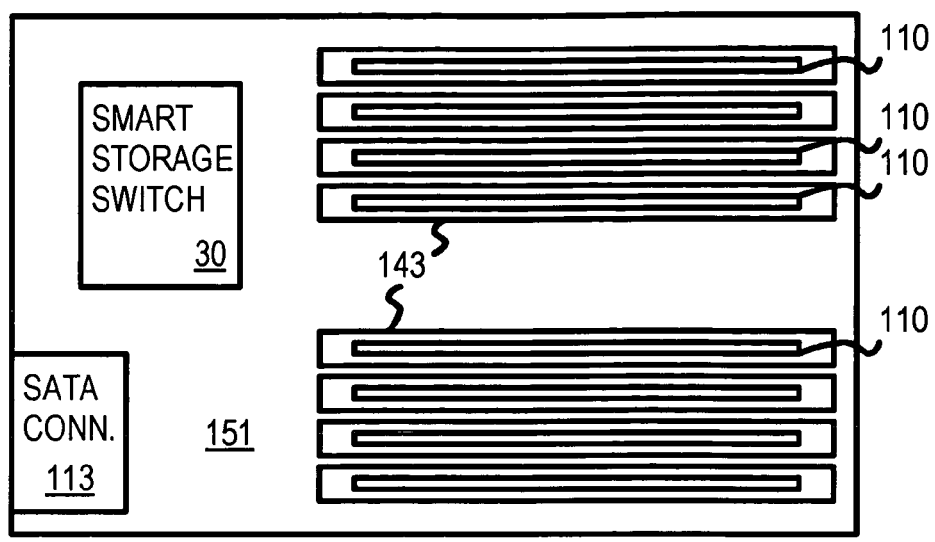

FIG. 13C shows a top view of a SATA storage drive. Board 151 has smart storage switch 30 and sockets 143 mounted thereon. Flash modules 110 of FIGS. 13A-B are inserted into sockets 143 and are connected by wiring traces on board 151 to smart storage switch 30. SATA connector 113 connects smart storage switch 30 to a host's SATA bus, such as when board 151 is plugged into slots 155 of FIG. 12B and board 151 acts as a RAID drive.

Figure 13D:
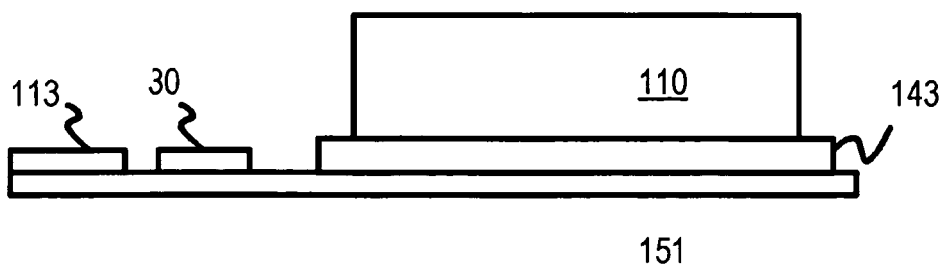

FIG. 13D shows a side view of the SATA storage drive of FIG. 13C. Flash modules 110 of FIGS. 13A-B are inserted into sockets 143 and are connected by wiring traces on board 151 to smart storage switch 30. SATA connector 113 connects smart storage switch 30 to a host's SATA bus.

Figure 14:
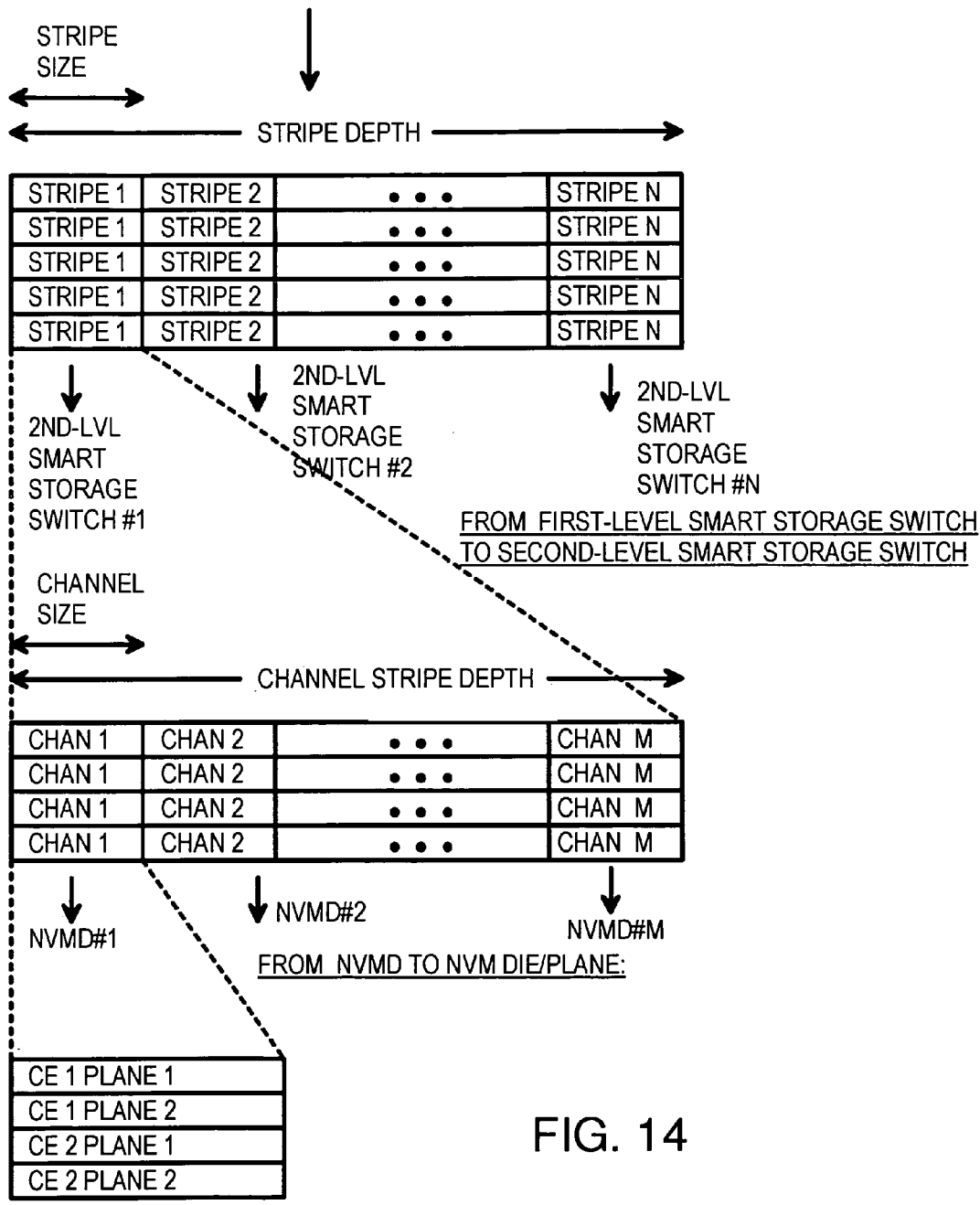
FIG. 14 shows three levels of data striping.

Tri-Level Striping—FIG. 14

The three levels of controllers shown in FIG. 1D include a first-level smart storage switch that receives host data and distributes the data across N channels. Each of these channels connects to a second-level smart storage switch. Then each second-level smart storage switch further distributes that channel's data across M NVMD 412 per second-level smart storage switch. Each NVMD can have several die and several planes per die, allowing further striping at the third level by each NVMD.

FIG. 14 shows three levels of data striping. Data from the host is stored by the first-level smart storage switch as stripes with a stripe depth of N times the stripe size. Each stripe is sent to a different one of the N second-level smart storage switches.

At the second level, each second-level smart storage switch has M channels that connect to NVMD's. There are a total of M NVMD per second-level smart storage switch. The channel stripe size is M times the channel size.

At the third level, each NVMD distributes data to flash memory that may be partitioned into several die, and several planes per die. The data width can be 8, 16, 32, or some other number of bits per plane. CE1 is the chip-enable for die 1, while CE2 is the chip-enable for die 2. In this example there are 2 NVM die per NVMD, and 2 planes per die, with a data width to NVM of 8 bits. NVMD 412 of FIG. 1B and other figures may have two flash-memory die per package, and each flash memory die has two planes. Having two die per package, and two planes per die increases flash access speed by utilizing two-plane commands of flash memory.

Figure 15A:
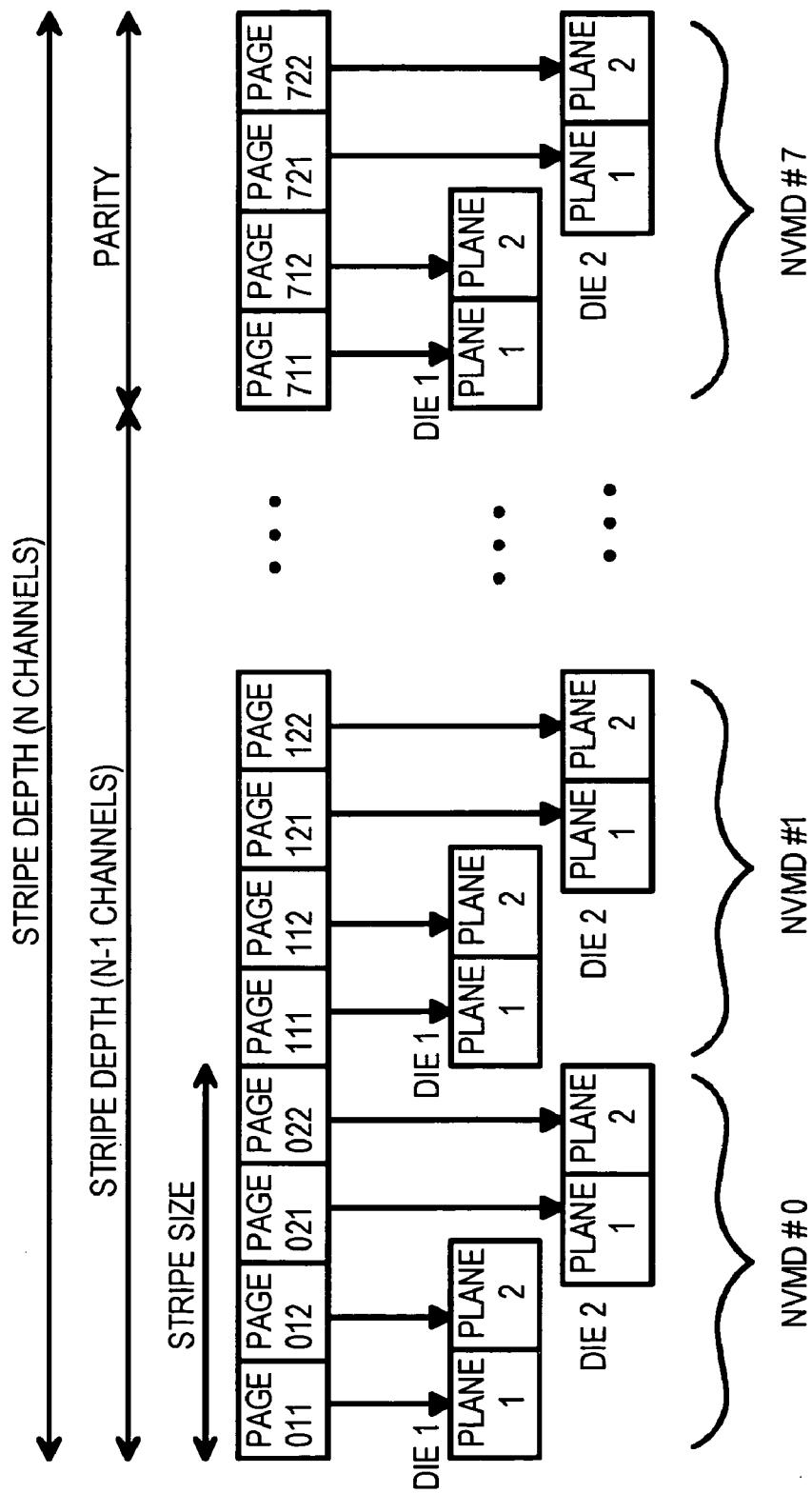
FIGS. 15A-C show examples of data striping.
Figure 15B:
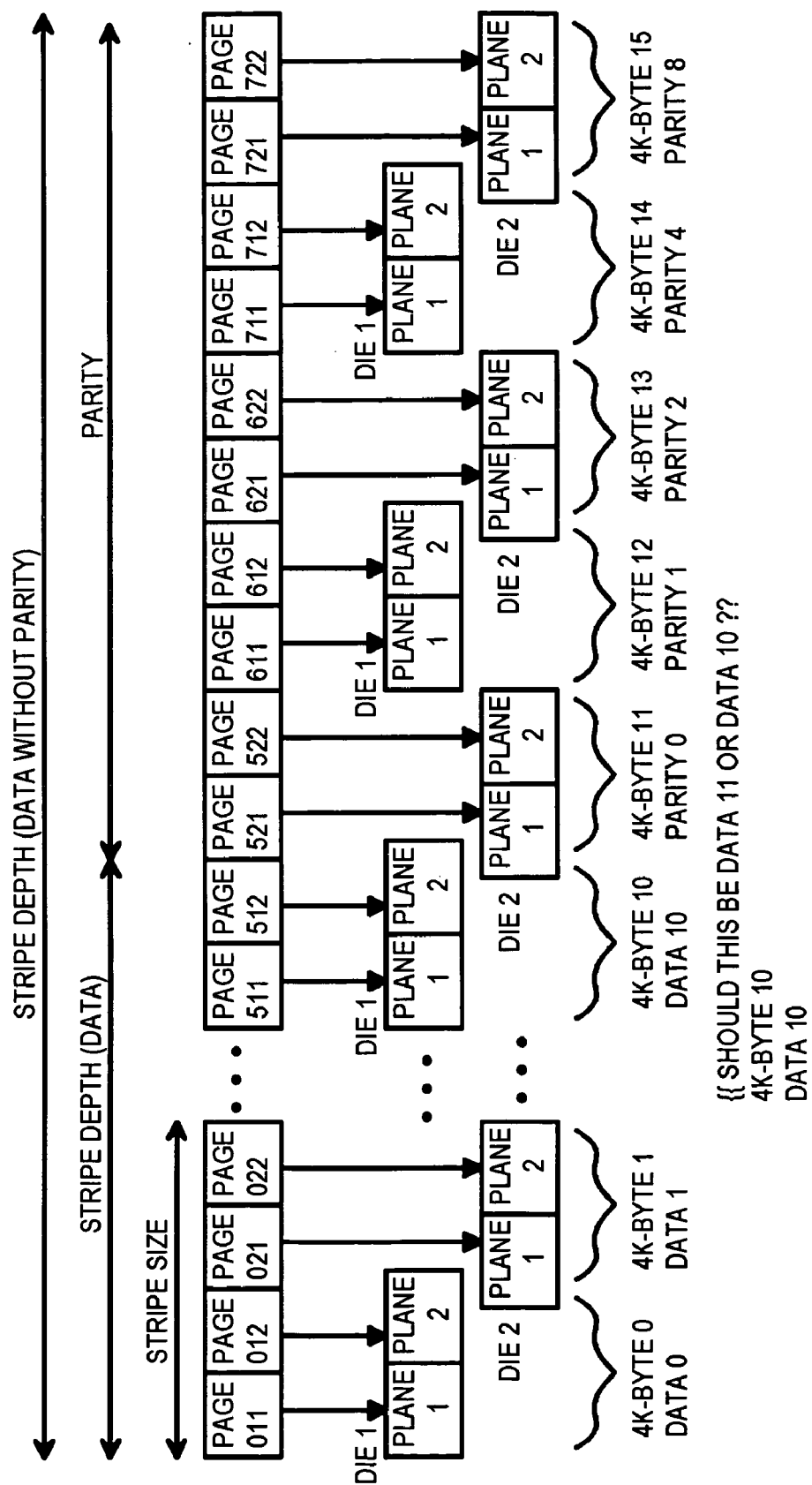
Figure 15C:
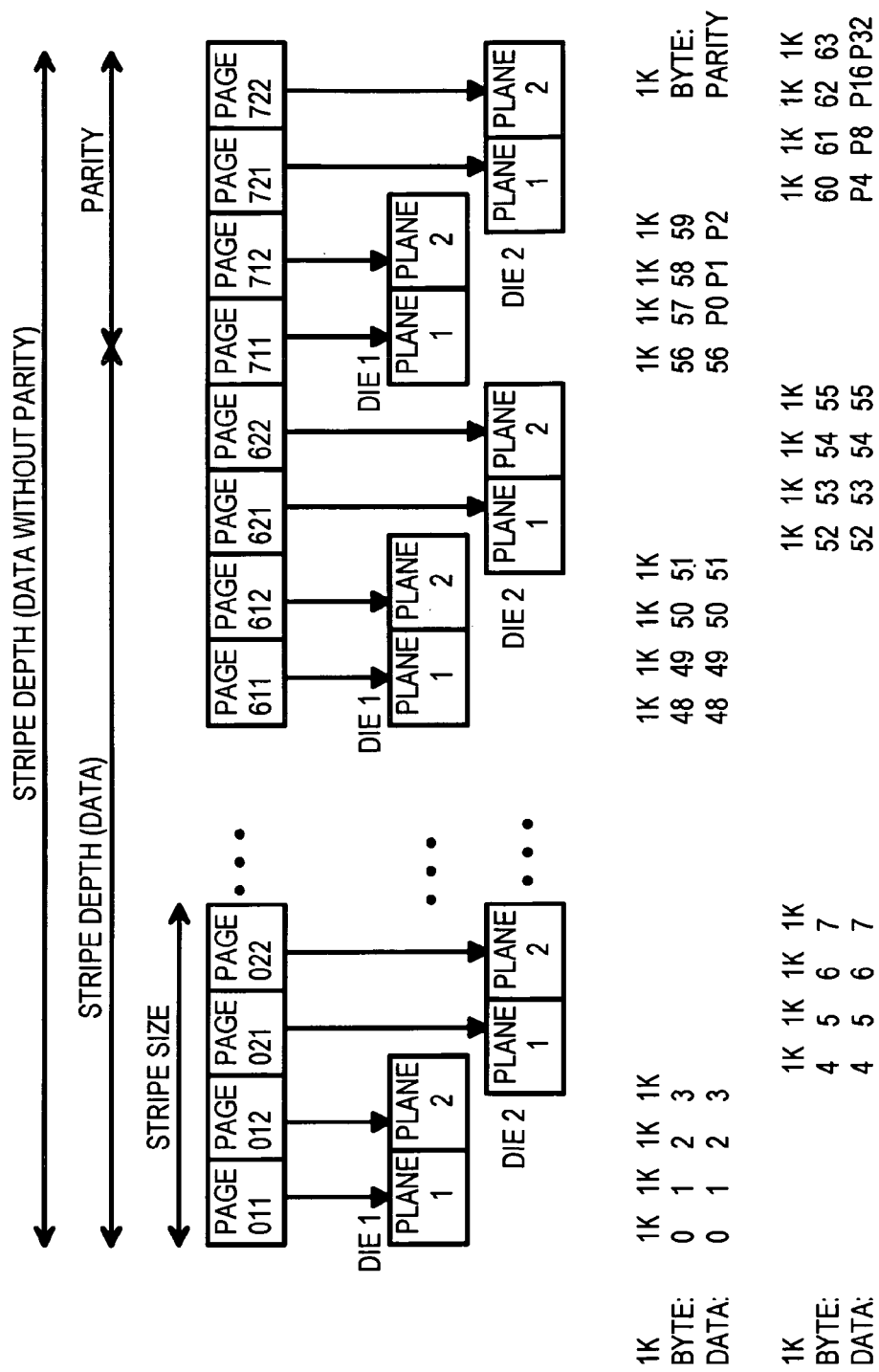

FIGS. 15A-C show examples of data striping. In FIG. 15A, the data striping has a stripe size that is closely coupled to the NVMD. The stripe size may be set to the number of pages that each NVMD can store simultaneously. For example, when each NVMD has two die and two planes per die, a total of four planes or four pages may be written at a time to each NVMD. Thus the stripe size is four pages.

The stripe depth is the number of channels times the stripe size, or N times 4 pages in this example. An 8-channel system with 8 NVMD of two die per channel and two planes per die has 8 times 4 or 32 pages of data as the stripe depth that is set by smart storage switch 30. Data striping methods may change according to the LBA-NVMD physical flash memory architecture, when either the number of die or planes is increased, or the page size varies. Striping size may change with the flash memory page size to achieve maximum efficiency.

One NVMD is reserved for storing parity for the other N–1 NVMD. The NVMD chosen for storing parity does not have to be fixed, but may be rotated among the N NVMD's under control of smart storage switch 30. RAID5-like protection is provided in this example.

In FIG. 15B, a 4K-byte data chunk is used. The 4K data chunk is larger than 1K but smaller than the size of the NVMD stripe size. A Hamming code may be used to locate errors. Two and a half NVMD are used to store parity or other ECC information in this example. A Hamming code such as (16, 11) with 11 data and 5 parity 4K-byte chunks is used in this example.

In FIG. 15C, a 1K-byte data chunk is used. The 1K data chunk is smaller than the size of the NVMD stripe size. A Hamming code may be used to protect against one 1K-byte error, but a whole page may be lost due to read/write disturbances of adjacent memory cells.

Only one NVMD is used to store parity or other ECC information in this example. A Hamming code such as (64, 57) with 57 data and 7 parity 1K-byte chunks is used in this example.

While one level of smart storage switch 30 has been described, two levels of smart storage switches may be used to distribute the data over stripes on multiple levels. Both horizontal and vertical ECC may be used. Entire pages may be reserved for vertical ECC while some number of parity bits per page are reserved for horizontal ECC. This may be especially useful for read-modify-write cycles and for use with SDRAM 60. Various other strengths of error detection and error correction may be substituted using different Hamming codes.

Figure 16A:
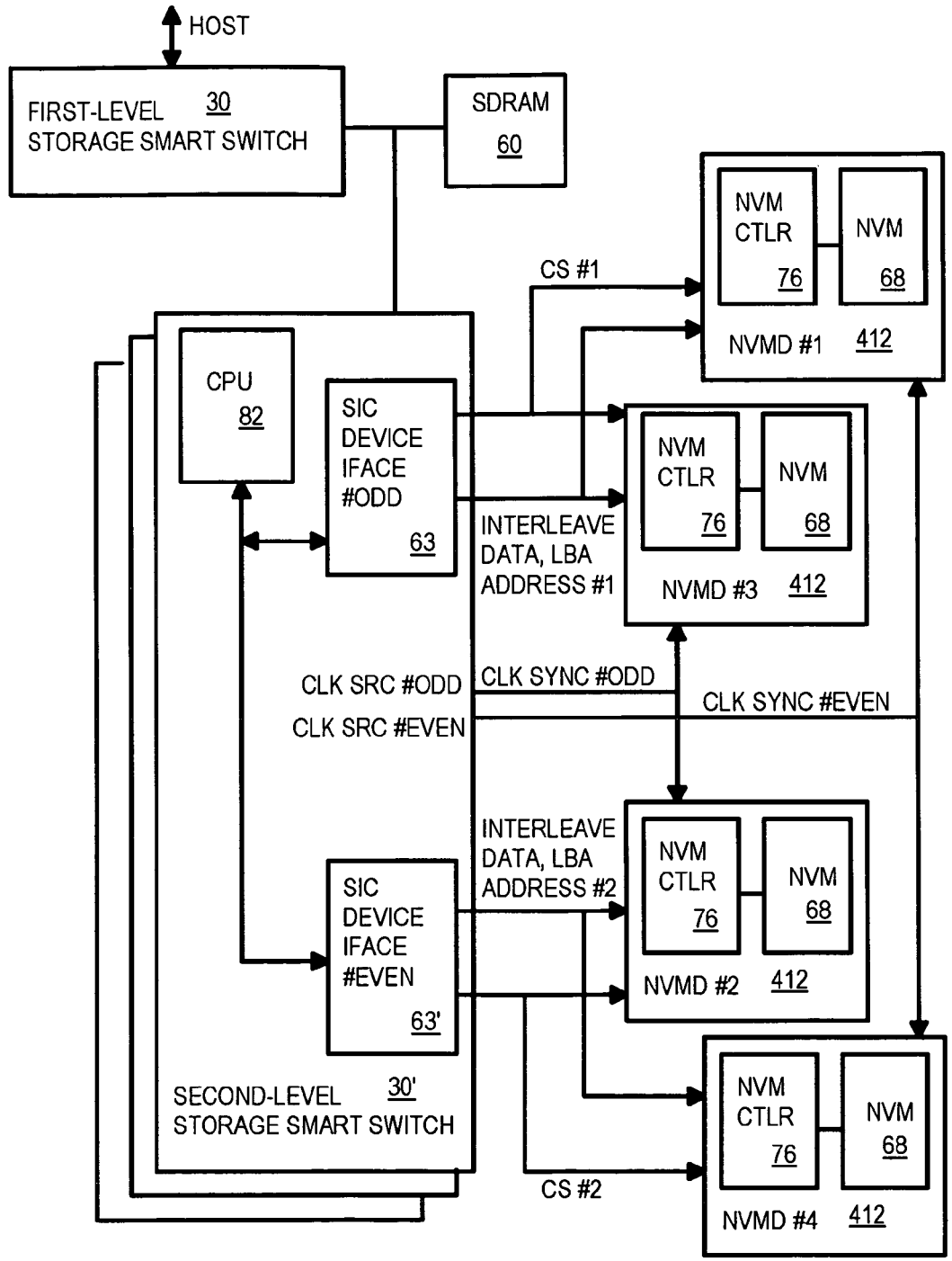
FIG. 16A highlights interleaving among two channels of flash using two levels of smart storage switches.

Tri-Level with Interleaving—FIG. 16A

FIG. 16A highlights interleaving among two channels of flash using two levels of smart storage switches. An internal bus in second-level smart storage switch 30' connects to multiple flash channel interfaces 63, 63' for odd and even interleaves. CPU 82 is a processor such as virtual storage processor 140 in FIG. 3, or another processor that receives and decodes requests sent over the internal bus.

Each NVMD 412 may have multiple channels of flash memory, NVM 68. CPU 82 sends some requests to first flash channel interface 63, for data stored in NVM 68 in first and second NVMD 412, while other requests are sent by CPU 82 to second flash channel interface 63', for data stored in NVM 68 in third and fourth NVMD 412.

First flash channel interface 63 generates interleaved control, data, and addresses #1 and device select CS#1 that address and enable first and second NVMD 412, one at a time. Second flash channel interface 63' generates interleaved control, data, and addresses #2 and device select CS#2 that address and enable third and fourth single-NVMD 412.

Two clock sources are used. Clock source #ODD drives first clock CLK SYNC #ODD to second and third NVMD 412, while clock source #EVEN drives second clock CLK SYNC #EVEN to first and fourth NVMD 412. The two clocks may be non-overlapping in time, allowing selection between NVMD 412 in the first channel, or among NVMD 412 in the second channel. One clock source may be stopped while the other clock is being pulsed. The clock sources could also be used with an interleave select signal or an address bit.

Multiple second-level smart storage switches 30' may be driven by data from first-level smart storage switch 30, which connects to a host and buffers data in SDRAM 60. A CPU inside first-level smart storage switch 30 acts as a master processing unit while CPU 82 in second-level smart storage switch 30' acts as a channel processing unit. A channel dispatching unit (not shown) inside first-level smart storage switch 30 distributes and dispatches data among the second-level smart storage switches 30'.

Figure 16B:
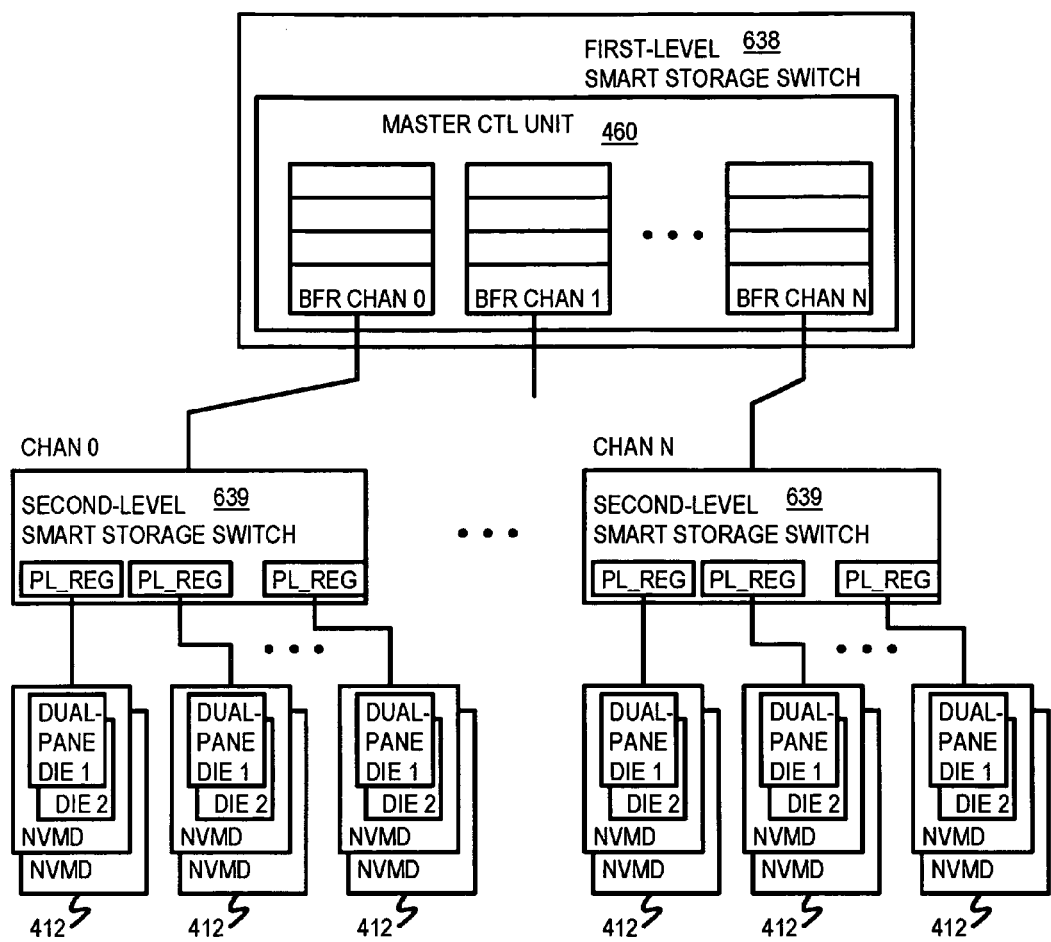
FIG. 16B highlights three-level striping using high and low-level smart storage switches.

FIG. 16B highlights three-level striping using high and low-level smart storage switches. First-level smart storage switch 638 receives host data and stores it in rows of channel buffers in master control unit 460. The first row of channel buffer 0 is filled, then the first row of channel buffer 1, etc., until the first row of channel buffer N is filled before starting to fill the second row.

Each buffer channel sends data to a different one of several second-level smart storage switches 639. The data is distributed across pipeline registers in each second-level smart storage switch 639. The pipeline register data is then sent to one pair of NVMD 412 that is connected to that second-level smart storage switch 639. Each NVMD 412 has two die and each die has two planes, so each NVMD can store 4 pages at a time. The pipeline registers each hold 8 pages of data.

There are M pairs of NVMD 412 for each of the N second-level smart storage switches 639. The stripe depth per NVMD is 8 pages; the stripe depth per channel (per second-level smart storage switch 639) is M*8 pages; and the high-level stripe depth for first-level smart storage switch 638 is N*M*8 pages.

Figure 16C:
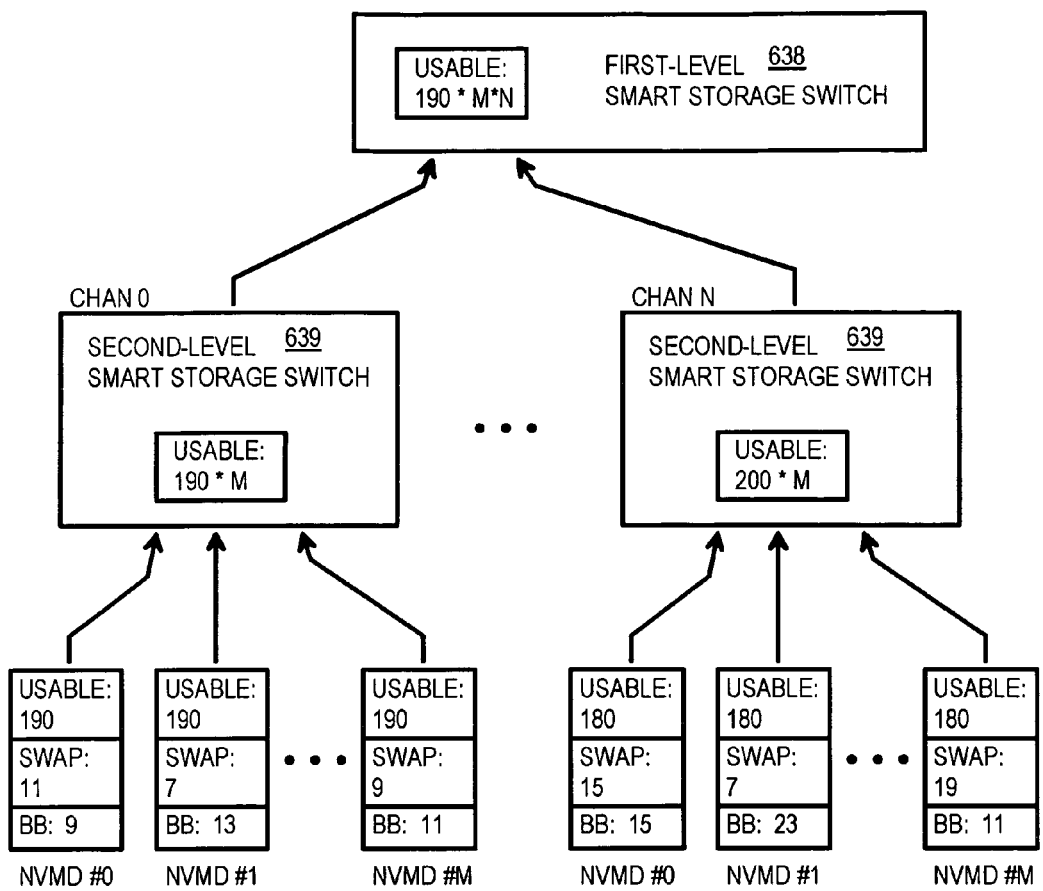
FIG. 16C highlights three-level truncation using high and low-level smart storage switches.

FIG. 16C highlights three-level truncation using high and low-level smart storage switches. Each NVMD tracks the number and location of bad blocks in its NVM. The usable area for striped data and the swap area for relocated bad block data are also stored for each NVMD. This information is reported back up to second-level smart storage switch 639, which tracks the usable area for all M NVMD attached to it. The usable area of all NVMD attached to one second-level smart storage switch 639 is set to the same value for ease of striping and interleaving. For example, for channel 0, each NVMD has a usable area of 190, so the total usable area for channel 0 is 190*M.

The usable area of all second-level smart storage switches 639 are reported back up to first-level smart storage switch 638. The smallest usable area is selected and applied to all second-level smart storage switches 639 for ease of striping the data. In this example, total usable area is 190*M*N for N channels of second-level smart storage switches 639.

Figure 16D:
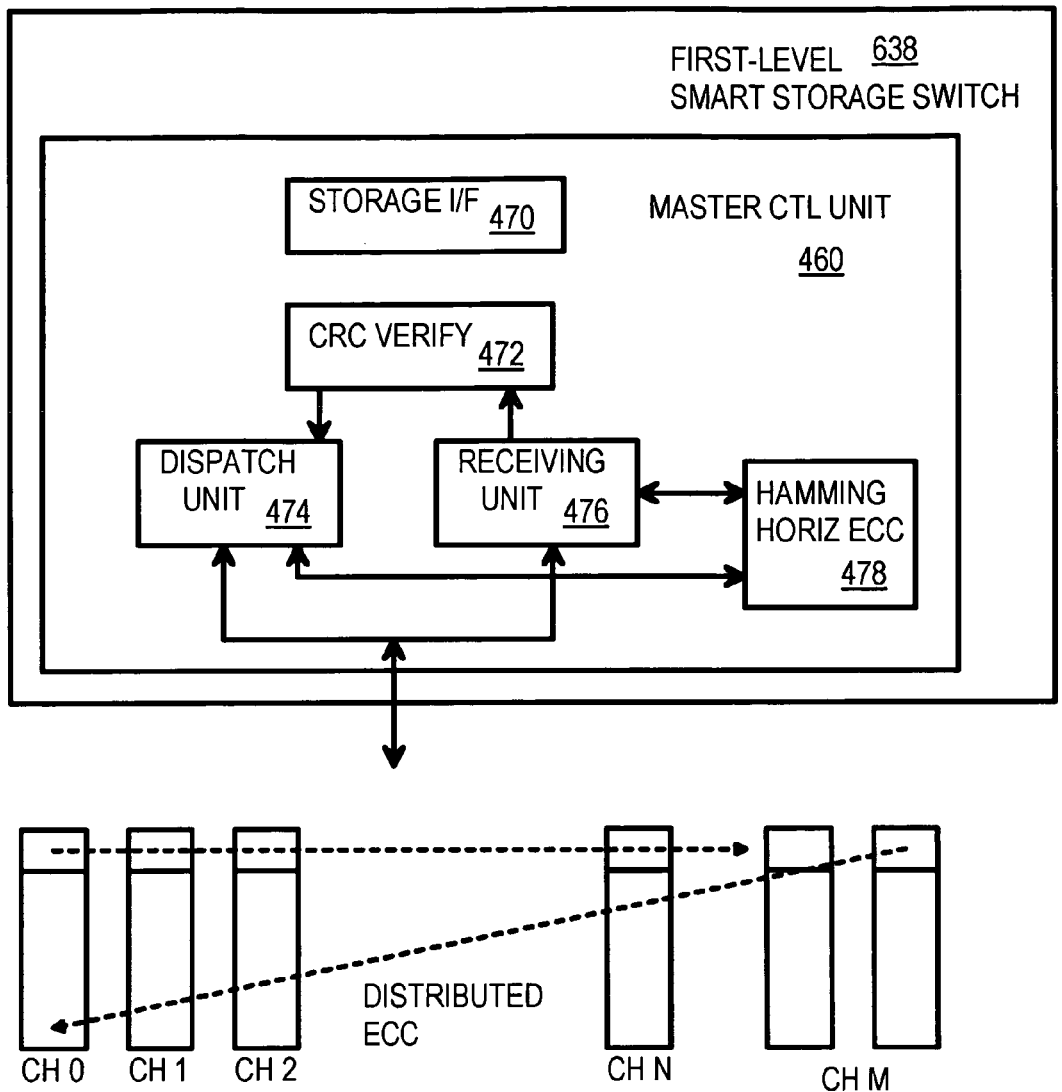
FIG. 16D highlights three-level ECC using high and low-level smart storage switches.

FIG. 16D highlights three-level ECC using high and low-level smart storage switches. At the high level, first-level smart storage switch 638 generates and checks horizontal ECC using Hamming horizontal ECC code unit 478 in master control unit 460. Host data from storage interface 470 has its cyclical-redundancy-check (CRC) from the host verified by CRC verifier 472 and then dispatched to the channels (second-level smart storage switches 639) by dispatch unit 474, along with horizontal ECC code generated by Hamming horizontal ECC code unit 478. For reads of flash memory, receiving unit 476 sends parity or ECC data to Hamming horizontal ECC code unit 478, which checks and corrects error in the data sent back to the host.

The horizontal ECC may be stored in channel M while the data is stored in channels 0-N. Vertical ECC may be distributed among the 0-N and M channels.

Both levels can use single-error correction, double-error detection codes. RAID-5 is one possible special case. ECC can be distributed both horizontally and vertically. The vertical ECC is stored in the multiple NVMD of channel M, while the horizontal or page ECC is stored in the one NVMD of channel N.

Figure 17:
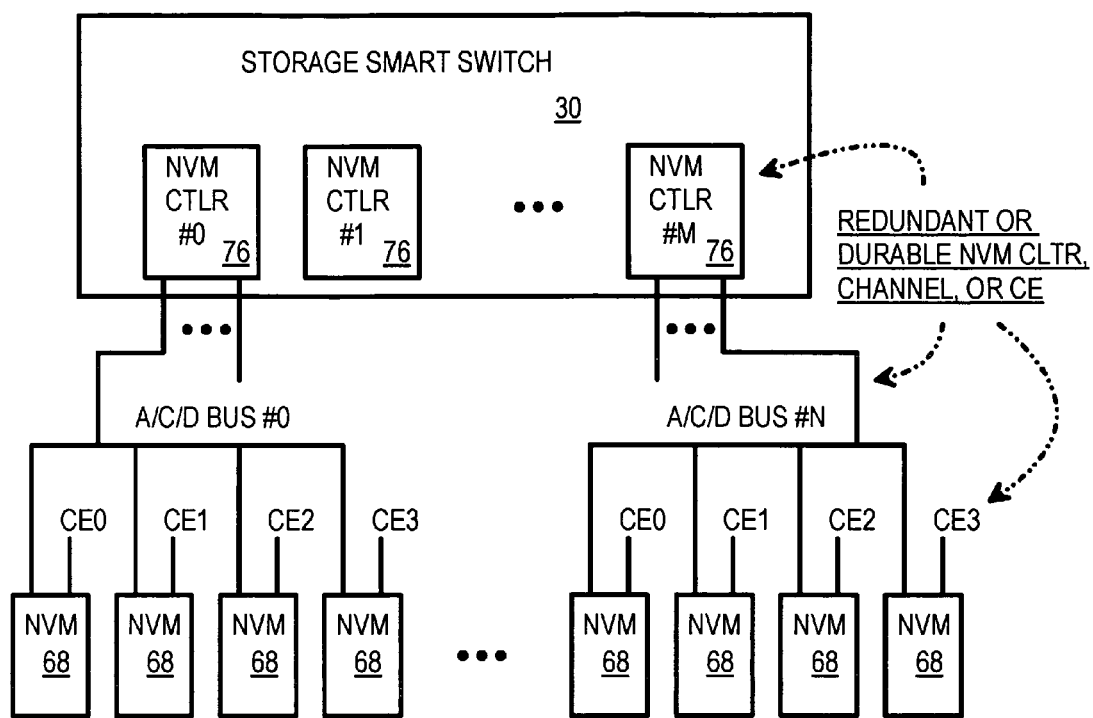
FIG. 17 shows redundant controllers, channels, and chip-enable signals in a flash system.

FIG. 17 shows redundant controllers, channels, and chip-enable signals in a flash system such as shown in FIG. 1A. Smart storage switch 30 has many NVM controllers 76, from #0 to #M. Each NVM controller 76 drives channel #0 to #N shared address/command/data bus. Each bus is connected to all four NVM flash memory 68. Each NVM controller 76 also drives four separate chip-enable (CE) control signals, each CE to a different one of the four NVM flash memory 68.

Smart storage switch 30 generates parity from the first-level stripes to all (M-1) NVM controllers 76 and stores this parity into NVM controller 76 #M. Striped data access is faster because several NVM controllers 76 are accessed in parallel; however, the non-striped scattered data is still accessible but at a performance penalty.

When one of NVM controllers 76 has a very high wear, it can be removed from striping and the remaining NVM controllers 76 are used. One of NVM flash memory 68 for #M NVM controller 76 may be used to store remapped data, such as the fourth NVM flash memory 68 that is accessed by CE3. Thus channel #M can be used for parity storage and for redirected or remapped data from other channels. If a hardware failure occurs, channel #M can be used as replacement hardware.

If redundancy is implemented, there are more than three possible implementations. The first implementation is that the data size is equal to NVM controller 76 data stripe size. One NVM controller 76 is used as parity to protect one known location failure of NVM controllers 76. Two NVM controllers 76 are used as parities to protect two known locations of failure of NVM controllers 76. Or if the failure location of NVM controller 76 is unknown, then several NVM controllers 76 need be used as parity to protect the rest of the data in NVM controllers 76. A one-error-correction and two-error-detection scheme is used such as a Hamming code algorithm. Hamming codes have the following parity bit requirement: 4 parity bits for 4 data bits (8, 4), or 5 parity for 11 data bits (16, 5), or 6 parity bits for 26 data bits (32, 6), or 7 parity bits for 57 data bits (64, 7), or 8 parity bits for 120 data bits (128, 8).

The second implementation is that the data size is equal to one channel of the data stripe size of NVM controller 76. A Hamming code algorithm of one error correction and two error detection is used. There are a total M*N channels in this example. If there are M=4 NVM controllers 76 and each has N=4 channels, 16 channels are in the SSD, Hamming code (16, 5) with 5 parities and 11 data. As an example, for NVM controller 76 #0 and #1, all channels are data channels for storing host data. NVM CTRL #2 has three channels that are data channels and one channel that is a parity channel. NVM controller 76 #2 has all channels as parity channels.

The third implementation is that the data size is equal to one CE stripe data size. There are total of M*N*4 CE data stripes. In this example of 64 CE data stripes, Hamming code (64, 7) with 7 parities and 57 data will be used. As an example, NVM controllers 76 #0, #1, and #2 will be for data. NVM controller 76 #3's channel #0 and #1 are data also. NVM controller 76 #3's channel #2 CE0 is data. The rest of NVM controllers 76 #3 are parities. The data size can be further down to page size as the data size unit. The flash ECC protection unit will be the smallest data size.

Redundancy allows the system to correct error data through generated parity bits (sometimes called meta data). When no redundancy is provided, no parity data is needed. Then this parity storage area can be used to store data. If one NVMD or one channel of NVMD or one CE chip is reserved as a spare, then when one NVMD or one channel of NVMD or one CE chip fails, this spare can be used as a replacement of the failed one through first level mapping logic 517.

There are also three possible replacement areas. The first implementation is using more than one unit of NVM controllers 76, either using the spare NVM controller 76 to replace the erring NVM controller 76 or remapping partial of the erring NVM controller 76 to the spare NVM controller 76. The second implementation is using one or more channels of NVM controller 76 as the spare area. One of these channels replaces the erring channel or remaps part of the erring channel to the spare channel. The third implementation is using one or more chips (CE) as the spare area. One of these chips replaces the erring chip or remaps part of the erring chip to the spare chips.

Wear-Leveling—FIG. 18

FIG. 18A-D highlight static wear leveling. Both dynamic and static wear leveling can be performed. Dynamic wear leveling is performed by NVM controller 76, which move pages of data that is not stale from a source block to a shadow block so that the entire source block contains only stale data. Then the stale source block is erased and recycled to the pool of available physical blocks. This is performed during normal operation. When a new physical block needs to be allocated for new data, the physical block with the lowest erase count is chosen, or some kind of procedure is used to preferentially select blocks with lower erase counts over blocks with higher erase counts.

Static wear leveling is an additional level of wear leveling that is performed at power up. A static wear leveling routine searches for the physical block with the lowest erase count and the physical block with the largest erase count and swaps these two physical blocks.

Figure 18A:
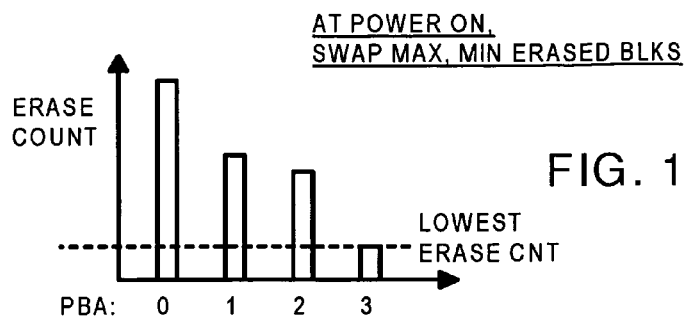
FIG. 18A-D highlight static wear leveling.
Figure 18B:
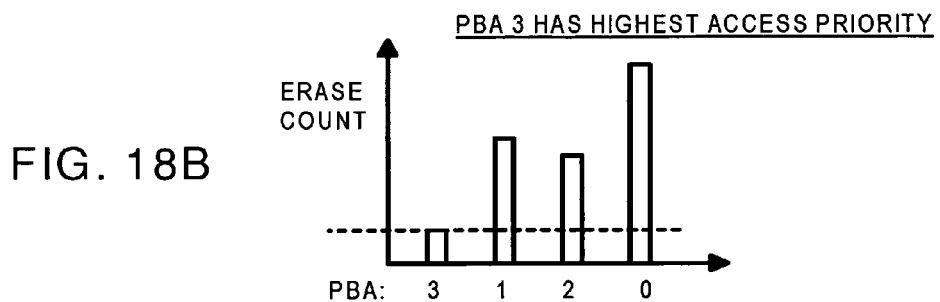

In FIG. 18A, the erase counts for four physical blocks are shown on the graph. The block PBA3 has the lowest erase count and the block PBA0 has the highest erase count and is the most worn. In FIG. 18B, these 2 physical blocks are swapped by reading the data from both blocks and writing the data that was read from PBA0 to PBA3, and writing the data that was read from PBA3 to PBA0. The rapidly changing data from PBA0 has been moved to least-worn PBA3, which has the highest access priority. PBA0 contains data changed more often and PBA3 is the data seldom used such as code. By exchange these two blocks, the erase count of PBA0 will be reduced.

For wear leveling, the emptied PBA with smallest ERASE COUNT will be used first, so it has the highest Access Priority. The rapidly changing data from PBA0 actually means that the LBA it mapped to is changed more frequently. Exchanging PBA0 and PBA3 exchanges the LBA's assigned to those physical blocks. PBA0 stays with the LBA less frequently changed. PBA3 is changed due to the LBA change and is going to be recycled and reused.

Figure 18C:
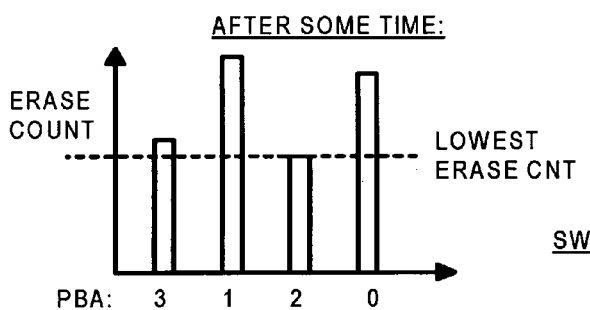
Figure 18D:
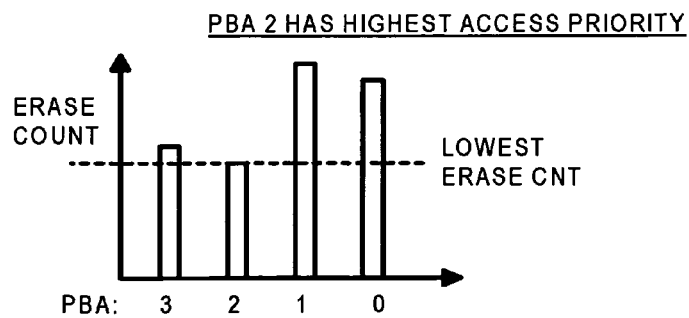

In FIG. 18C, some time has passed, and the system has been powered up again. Block PBA1 has been erased many additional times and is now the most-worn block with the highest erase count. Block PBA2 has the lowest erase count. In FIG. 18D, blocks PBA1 and PBA2 are swapped. The rapidly changing data from PBA1 has been moved to least-worn PBA2, which now has the highest access priority.

Data Caching—FIG. 19

Figure 19A:
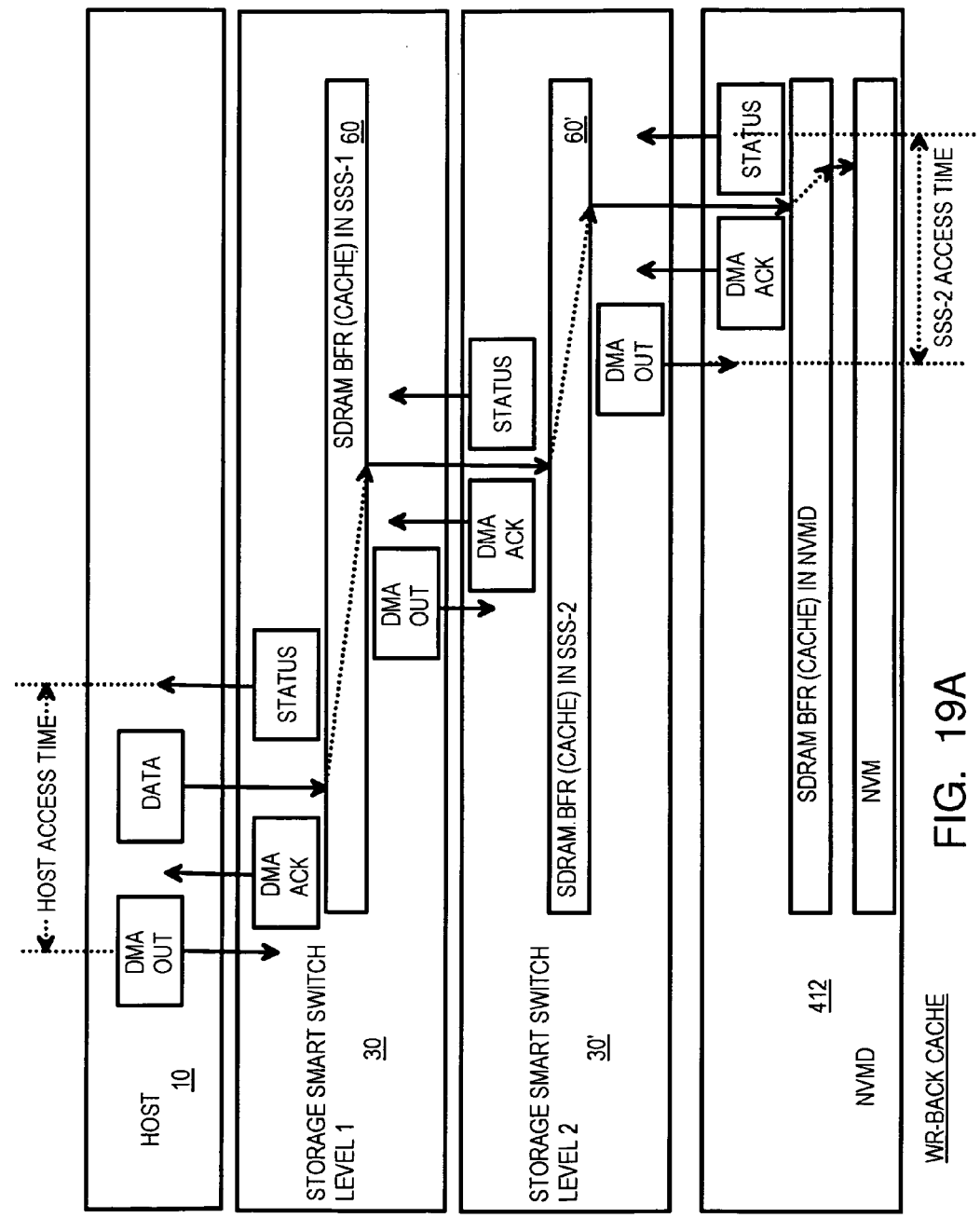
FIG. 19A-C highlight data caching in a hybrid flash system.
Figure 19B:
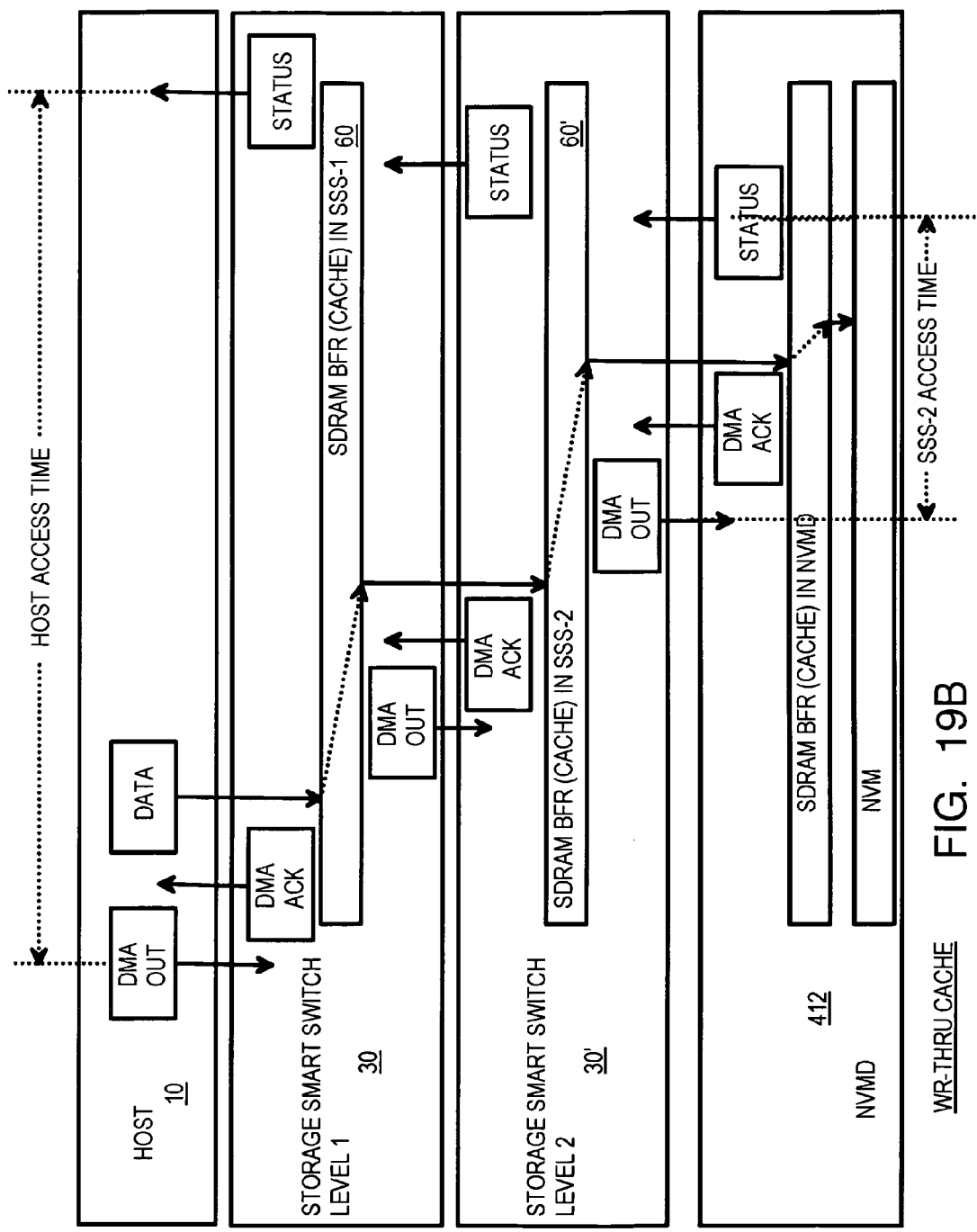
Figure 19C:
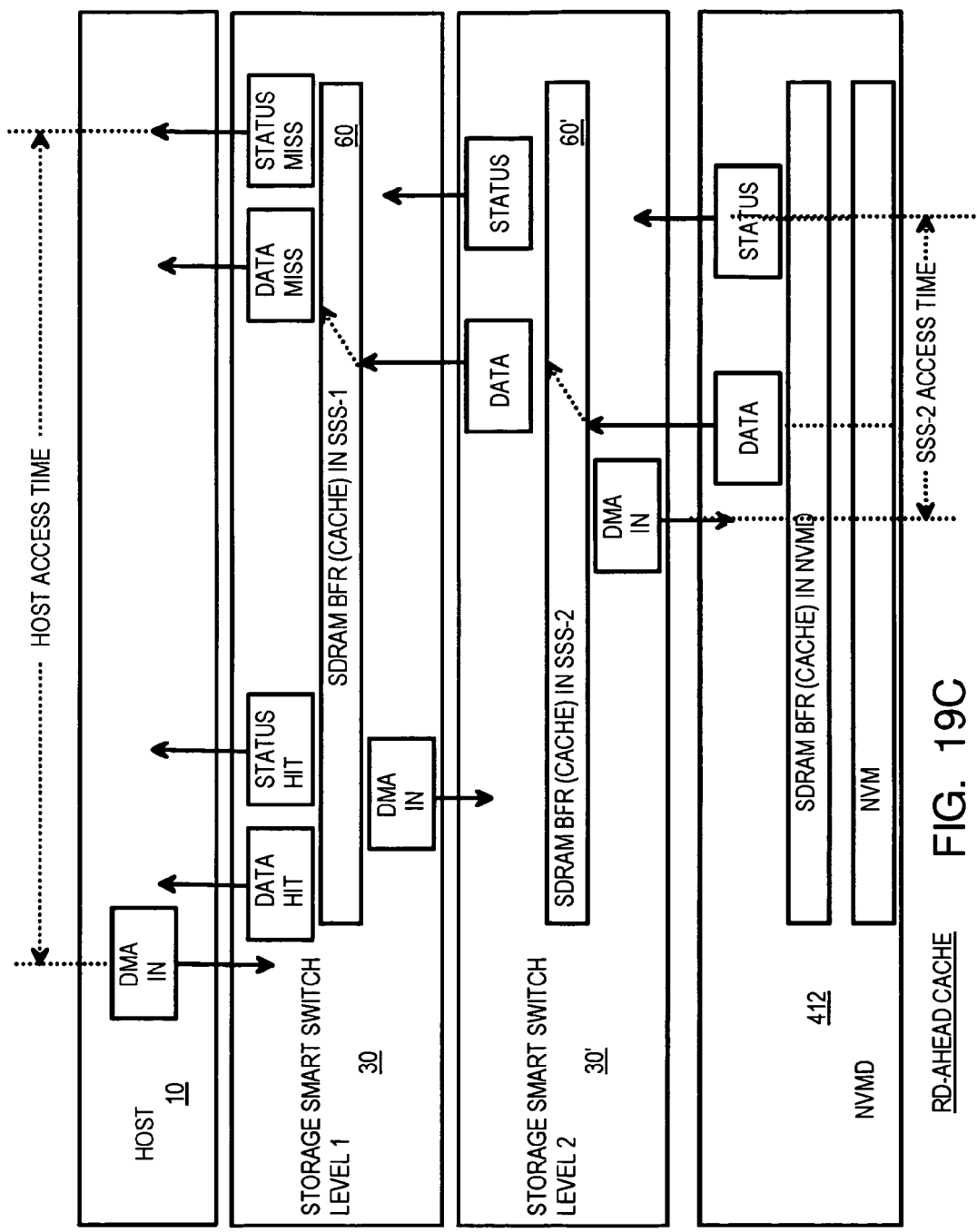

FIG. 19A-C highlight data caching in a hybrid flash system. Data can be cached by SDRAM 60 in first-level smart storage switch 30, by SDRAM 60' in second-level smart storage switch 30', and by another SDRAM buffer in NVM controller 76. See FIG. 1A of the parent application, U.S. Ser. No. 12/252,155, for more details of caching.

In FIG. 19A, SDRAM 60 operates as a write-back cache for first-level smart storage switch 30. Host motherboard 10 issues a DMA out (write) command to smart storage switch 30, which sends back a DMA acknowledgement. Then host motherboard 10 sends data to first-level smart storage switch 30, which stores this data in SDRAM 60. Once the host data is stored in SDRAM 60, first-level smart storage switch 30 issues a successful completion status back to host motherboard 10. The DMA write is complete from the viewpoint of host motherboard 10, and the host access time is relatively short.

After the host data is stored in SDRAM 60, first-level smart storage switch 30 issues a DMA write command to second-level smart storage switch 30', which returns a DMA acknowledgement to first-level smart storage switch 30. Then first-level smart storage switch 30 sends the data stored in SDRAM 60. The data is buffered in SDRAM 60' of second-level smart storage switch 30'. A successful completion status back to first-level smart storage switch 30.

Second-level smart storage switch 30' issues a DMA write command to NVMD 412. The NVM controller returns a DMA acknowledgement, and then second-level smart storage switch 30' sends the data stored in SDRAM 60'. The data is buffered in the SDRAM buffer 77 in NVM controller 76 or another buffer and then written to flash memory. Once the data has been written to flash memory, a successful completion status back to second-level smart storage switch 30'. The internal DMA write is complete from the viewpoint of second-level smart storage switch 30'. The access time of second-level smart storage switch 30' is relatively longer due to write-through mode. However, this access time is hidden from host motherboard 10.

In FIG. 19B, SDRAM 60 operates as a write-through cache, but the NVMD operates as a write-back cache. Host motherboard 10 issues a DMA out (write) command to first-level smart storage switch 30, which sends back a DMA acknowledgement. Then host motherboard 10 sends data to first-level smart storage switch 30, which stores this data in SDRAM 60.

After the host data is stored in SDRAM 60, first-level smart storage switch 30 issues a DMA write command to second-level smart storage switch 30', which returns a DMA acknowledgement to first-level smart storage switch 30. Then first-level smart storage switch 30 sends the data stored in SDRAM 60. The data is buffered in SDRAM 60' of second-level smart storage switch 30'. However, a successful completion status back to first-level smart storage switch 30 is delayed until the write to flash memory by NVMD 412.

Second-level smart storage switch 30' issues a DMA write command to NVMD 412. The NVM controller returns a DMA acknowledgement, and then second-level smart storage switch 30' sends the data stored in SDRAM 60'. The data is stored in the SDRAM buffer 77 in NVM controller 76 (FIG. 1B) or another buffer and later written to flash memory. Once the data has been written to flash memory, a successful completion status is sent back to second-level smart storage switch 30', and then to first-level smart storage switch 30. The internal DMA write is then complete from the viewpoint of first-level smart storage switch 30.

First-level smart storage switch 30 issues a successful completion status back to host motherboard 10. The DMA write is complete from the viewpoint of host motherboard 10, and the host access time is relatively long.

In FIG. 19C, all of NVMD 412, first-level smart storage switch 30, and second-level smart storage switch 30' operate as read-ahead caches. Host motherboard 10 issues a DMA in (read) command to first-level smart storage switch 30 and waits for the read data.

When the data is found in SDRAM 60 of first-level smart storage switch 30, the hit data and a hit status can be immediately returned to host 10. Second-level smart storage switch 30' and NVMD 412 do not need to be consulted.

However, when a miss in SDRAM 60 occurs, first-level smart storage switch 30 found no cache hit in SDRAM 60. SDRAM 60 then issues a DMA read command to second-level smart storage switch 30', which also misses in its SDRAM 60'.

Second-level smart storage switch 30' then issues a DMA read command to NVMD 412. In this case, the NVM controller found a cache hit, then reads the data from its cache, SDRAM buffer 77 in NVM controller 76 (FIG. 1B), which has earlier read or write this data, such as by speculatively reading ahead after an earlier read or write. This data is sent to second-level smart storage switch 30' and stored in SDRAM 60', and then sent to first-level smart storage switch 30 and stored in its SDRAM 60 and passed on to host motherboard 10.

NVMD 412 sends a successful completion status back to second-level smart storage switch 30', which sends a successful completion status back to first-level smart storage switch 30. The internal DMA read is complete from the viewpoint of smart storage switches 30, 30'. First-level smart storage switch 30 issues a successful completion status back to host motherboard 10. The DMA read is complete from the viewpoint of host motherboard 10. The host access time is relatively long, but is much shorter than if flash memory had to be read.

Alternate Embodiments

Several other embodiments are contemplated by the inventors. For example, NVMD 412 can be one of the following: a block mode mapper with hybrid SLC/MLC flash memory, a block mode mapper with SLC or MLC, a page mode mapper with hybrid MLC/SLC flash memory, a page mode mapper with SLC or MLC. Alternatively, NVMD 412 in flash module 110 can include raw flash memory chips. NVMD 412 and smart storage switch 30 in a flash module can include raw flash memory chips and a flash controller as shown in FIG. 3A-C of the parent application U.S. Ser. No. 12/252,155.

Each block may be divided into multi-page zones. For example, a block may have 16 pages and 4 zones, with 4 pages per zone. Some of the mapping may be for zones rather than for individual pages in this alternative embodiment. Alternatively, in a special case, there can be one page per zone. Fewer mapping entries are needed with zone-mode than for page-mode, since each zone is multiple pages.

The upper bits of the logical-sector address (LSA) from the host may select a cluster or district. All of the entries in a mapping table may be for the same district. When the district number from the LSA matches the district number of all the entries in the mapping table, the LBA from the LSA selects an entry in the mapping table. Hybrid mapping tables may also be used.

Copying of blocks for relocation is less frequent with page mapping since the sequential-writing rules of the MLC flash are violated less often in page mode than in block mode. This increases the endurance of the flash system and increases performance.

The mapping tables may be located in an extended address space, and may use virtual addresses or illegal addresses that are greater than the largest address in a user address space. Pages may remain in the host's page order or may be remapped to any page location. Other encodings are possible.

Many variations of FIG. 1A-B and others are possible. A ROM such as an EEPROM could be connected to or part of virtual storage processor 140, or another virtual storage bridge 42 and NVM controller 76 could connect virtual storage processor 140 to another raw-NAND flash memory chip or to NVM flash memory 68 that is dedicated to storing firmware for virtual storage processor 140. This firmware could also be stored in the main flash modules. Host storage bus 18 can be a Serial AT-Attachment (SATA) bus, a Peripheral Components Interconnect Express (PCIe) bus, a compact flash (CF) bus, or a Universal-Serial-Bus (USB), a Firewire 1394 bus, a Fibre Channel (FC) bus, etc. LBA storage bus interface 28 can be a Serial AT-Attachment (SATA) bus, an integrated device electronics (IDE) bus, a Peripheral Components Interconnect Express (PCIe) bus, a compact flash (CF) bus, a Universal-Serial-Bus (USB), a Secure Digital (SD) bus, a Multi-Media Card (MMC) bus, a Firewire 1394 bus, a Fibre Channel (FC) bus, various Ethernet buses, etc. NVM memory 68 can be SLC or MLC flash only or can be combined SLC/MLC flash. Mapper 46 in NVM controller 76 can perform one level of block mapping to a portion of SLC or MLC flash memory, and two levels of page mapping may be performed for the remaining SLC or MLC flash memory.

The flash memory may be embedded on a motherboard or SSD board or could be on separate modules. Capacitors, buffers, resistors, and other components may be added. Smart storage switch 30 may be integrated on the motherboard or on a separate board or module. NVM controller 76 can be integrated with smart storage switch 30 or with raw-NAND flash memory chips as a single-chip device or a plug-in module or board. SDRAM 60 can be directly soldered to card 300 or other boards or a removable SDRAM module may be plugged into a module socket.

Using multiple levels of controllers, such as in a president-governor arrangement of controllers, the controllers in smart storage switch 30 may be less complex than would be required for a single level of control for wear-leveling, bad-block management, re-mapping, caching, power management, etc. Since lower-level functions are performed among flash memory chips 68 within each flash module by NVM controllers 76 as a governor function, the president function in smart storage switch 30 can be simplified. Less expensive hardware may be used in smart storage switch 30, such as using an 8051 processor for virtual storage processor 140 or smart storage transaction manager 36, rather than a more expensive processor core such as a an Advanced RISC Machine ARM-9 CPU core.

Different numbers and arrangements of flash storage blocks can connect to the smart storage switch. Rather than use LBA storage bus interface 28 or differential serial packet buses, other serial buses such as synchronous Double-Data-Rate (DDR), ONFI, Toggle NAND, a differential serial packet data bus, a legacy flash interface, etc.

Mode logic could sense the state of a pin only at power-on rather than sense the state of a dedicated pin. A certain combination or sequence of states of pins could be used to initiate a mode change, or an internal register such as a configuration register could set the mode. A multi-bus-protocol chip could have an additional personality pin to select which serial-bus interface to use, or could have programmable registers that set the mode to hub or switch mode.

The transaction manager and its controllers and functions can be implemented in a variety of ways. Functions can be programmed and executed by a CPU or other processor, or can be implemented in dedicated hardware, firmware, or in some combination. Many partitionings of the functions can be substituted. Smart storage switch 30 may be hardware, or may include firmware or software or combinations thereof.

Overall system reliability is greatly improved by employing Parity/ECC with multiple NVM controllers 76, and distributing data segments into a plurality of NVM blocks. However, it may require the usage of a CPU engine with a DDR/SDRAM cache in order to meet the computing power requirement of the complex ECC/Parity calculation and generation. Another benefit is that, even if one flash block or flash module is damaged, data may be recoverable, or the smart storage switch can initiate a "Fault Recovery" or "Auto-Rebuild" process to insert a new flash module, and to recover or to rebuild the "Lost" or "Damaged" data. The overall system fault tolerance is significantly improved.

Wider or narrower data buses and flash-memory chips could be substituted, such as with 16 or 32-bit data channels. Alternate bus architectures with nested or segmented buses could be used internal or external to the smart storage switch. Two or more internal buses can be used in the smart storage switch to increase throughput. More complex switch fabrics can be substituted for the internal or external bus.

Data striping can be done in a variety of ways, as can parity and error-correction code (ECC). Packet re-ordering can be adjusted depending on the data arrangement used to prevent re-ordering for overlapping memory locations. The smart switch can be integrated with other components or can be a stand-alone chip.

Additional pipeline or temporary buffers and FIFO's could be added. For example, a host FIFO in smart storage switch 30 may be may be part of smart storage transaction manager 36, or may be stored in SDRAM 60. Separate page buffers could be provided in each channel. A clock source could be added.

A single package, a single chip, or a multi-chip package may contain one or more of the plurality of channels of flash memory and/or the smart storage switch.

A MLC-based flash module may have four MLC flash chips with two parallel data channels, but different combinations may be used to form other flash modules, for example, four, eight or more data channels, or eight, sixteen or more MLC chips. The flash modules and channels may be in chains, branches, or arrays. For example, a branch of 4 flash modules could connect as a chain to smart storage switch 30. Other size aggregation or partition schemes may be used for different access of the memory. Flash memory, a phase-change memory (PCM), or ferroelectric random-access memory (FRAM), Magnetoresistive RAM (MRAM), Memristor, PRAM, SONOS, Resistive RAM (RRAM), Racetrack memory, and nano RAM (NRAM) may be used.

The host can be a PC motherboard or other PC platform, a mobile communication device, a personal digital assistant (PDA), a digital camera, a combination device, or other device. The host bus or host-device interface can be SATA, PCIE, SD, USB, or other host bus, while the internal bus to a flash module can be PATA, multi-channel SSD using multiple SD/MMC, compact flash (CF), USB, or other interfaces in parallel. A flash module could be a standard PCB or may be a multi-chip modules packaged in a TSOP, BGA, LGA, COB, PIP, SIP, CSP, POP, or Multi-Chip-Package (MCP) packages and may include raw-NAND flash memory chips or raw-NAND flash memory chips may be in separate flash chips, or other kinds of NVM flash memory 68. The internal bus may be fully or partially shared or may be separate buses. The SSD system may use a circuit board with other components such as LED indicators, capacitors, resistors, etc.

Directional terms such as upper, lower, up, down, top, bottom, etc. are relative and changeable as the system or data is rotated, flipped over, etc. These terms are useful for describing the device but are not intended to be absolutes.

NVM flash memory 68 may be on a flash module that may have a packaged controller and flash die in a single chip package that can be integrated either onto a PCBA, or directly onto the motherboard to further simplify the assembly, lower the manufacturing cost and reduce the overall thickness. Flash chips could also be used with other embodiments including the open frame cards.

Rather than use smart storage switch 30 only for flash-memory storage, additional features may be added. For example, a music player may include a controller for playing audio from MP3 data stored in the flash memory. An audio jack may be added to the device to allow a user to plug in headphones to listen to the music. A wireless transmitter such as a BlueTooth transmitter may be added to the device to connect to wireless headphones rather than using the audio jack. Infrared transmitters such as for IRDA may also be added. A BlueTooth transceiver to a wireless mouse, PDA, keyboard, printer, digital camera, MP3 player, or other wireless device may also be added. The BlueTooth transceiver could replace the connector as the primary connector. A Bluetooth adapter device could have a connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A two-level flash device comprising:
a smart storage switch which comprises:
an upstream interface to a host for receiving host commands to access non-volatile memory (NVM) and for receiving host data and a host address;
a smart storage transaction manager that manages transactions from the host;
a virtual storage processor that maps the host address to an assigned flash channel to generate a logical block address (LBA), the virtual storage processor performing a high level of mapping;
a high-level striping mapper, coupled to the virtual storage processor, that stores a stripe capacity, which is the size of data that is accessible in parallel, and a scattered capacity, which is the size of data that cannot be accessed in parallel, for each flash channel, wherein the stripe capacity for all flash channels has a same value, wherein the scattered capacity varies among the flash channels;
a virtual storage bridge between the smart storage transaction manager and a NVM controller through a LBA bus;
a plurality of NVM controllers, each NVM controller coupled to the LBA bus to receive the LBA generated by the virtual storage processor and the host data from the virtual storage bridge;
a low-level mapper, in the NVM controller, that maps the LBA to a physical block address (PBA), the low-level mapper generating the PBA for block-mapped host data, and the low-level mapper generating the PBA and a page number for host data that is page-mapped;
a plurality of flash channels that include the assigned flash channel, wherein a flash channel comprises:

NVM flash memory, coupled to the NVM controller, for storing the host data at a block location identified by the PBA generated by the low-level mapper in the NVM controller, and at a page location identified by the page number for the page-mapped host data.

2. The two-level flash device of claim 1 wherein the high-level striping mapper further comprises:
a truncation process, activated on power-up, for determining a size of the NVM flash memory in the plurality of flash channels, and for setting a truncation size for all flash channels.

3. The two-level flash device of claim 1 wherein the low-level mapper further comprises:
a bad block table that maps locations of bad blocks in the NVM flash memory controlled by the NVM controller;
wherein the NVM controller reports an available storage capacity to the smart storage switch by subtracting a capacity of the band blocks located by the bad block table.

4. The two-level flash device of claim 1 wherein the LBA bus comprises a Serial AT-Attachment (SATA) bus, a Serial small-computer system interface (SCSI) (SAS) bus, a fiber-channel (FC) bus, an InfiniBand bus, an integrated device electronics (IDE) bus, a Peripheral Components Interconnect Express (PCIe) bus, a compact flash (CF) bus, a Universal-Serial-Bus (USB), a Secure Digital Bus (SD), a MultiMediaCard (MMC), or a LBA bus protocol which transfers read and write commands, a starting page address with a sector offset, and a sector count.

5. The two-level flash device of claim 1 wherein each NVM controller further comprises an error-correction code (ECC) unit for appending page ECC to the host data sent to the assigned flash channel in the plurality of flash channels for storage in the NVM flash memory;
a high-level ECC unit, in the smart storage switch, for generating a stripe ECC from a stripe of the host data generated by the high-level striping mapper;
wherein the stripe ECC is sent to a stripe flash channel plurality of flash channels for storage in the NVM flash memory,
whereby both stripe ECC and page ECC are generated and stored.

6. The two-level flash device of claim 5 wherein the low-level mapper in the NVM controller is a physical to logical map that stores LBA at locations indicating a PBA.

7. The two-level flash device of claim 6 wherein the low-level mapper in the NVM controller further comprises:
a properties table that indicates when a block is a source block, a first shadow block, or a second shadow block;
wherein fresh data from the source block is copied to the second shadow block before the source block is erased and recycled.

8. The two-level flash device of claim 1 further comprising:
an end-of-command flag, stored in a page of the NVM flash memory after host data is stored, the end-of-command flag indicating an end of data for a host command;
a read searcher that reads blocks for the end-of-command flag to locate fresh data.

9. A three-level flash device comprising:
a high-level smart storage switch which comprises:
an upstream interface to a host for receiving host commands to access non-volatile memory (NVM) and for receiving host data and a host address;
a smart storage transaction manager that manages transactions from the host;
a virtual storage processor that maps the host address to an assigned flash channel to generate a logical block address (LBA), the virtual storage processor performing a high level of mapping;

a high-level striping mapper, coupled to the virtual storage processor, that stores a stripe capacity, which is the size of data that is accessible in parallel, and a scattered capacity, which is the size of data that cannot be accessed in parallel, for each flash channel, wherein the stripe capacity for all flash channels has a same value, wherein the scattered capacity varies among the flash channels;

a virtual storage bridge between the smart storage transaction manager and a LBA bus;

a second-level smart storage switch which comprises:

a second upstream interface to the high-level smart storage switch for receiving commands to access NVM and for receiving data and an address from the high-level smart storage switch;

a second-level smart storage transaction manager that manages transactions from NVM devices;

a channel storage processor that maps the address from the high-level smart storage switch to an assigned flash channel to generate a local logical block address (LBA), the channel storage processor performing a mapping to multiple NVM devices attached to the second-level smart storage switch;

a second-level mapper, coupled to the channel storage processor, that stores capacities of all NVM devices for each flash channel;

a plurality of NVM controllers, each NVM controller coupled to the LBA bus to receive the LBA generated by the channel storage processor and the data from the second-level smart storage switch;

a low-level mapper, in the NVM controller, that maps the LBA to a physical block address (PBA), the low-level mapper generating the PBA for block-mapped host data, and the low-level mapper generating the PBA and a page number for host data that is page-mapped;

a plurality of flash channels that include the assigned flash channel, wherein a flash channel comprises:

NVM flash memory, coupled to the NVM controller, for storing the host data at a block location identified by the PBA generated by the low-level mapper in the NVM controller, and at a page location identified by the page number for the page-mapped host data;

wherein the second-level smart storage switch accesses the plurality of flash channels as a stripe of multiple simultaneous accesses of the plurality of flash channel for data stored in the stripe capacity;

wherein the second-level smart storage switch accesses the plurality of flash channels as a single-channel access of one flash channel at a time for data stored in the scattered capacity;

whereby the scattered data is accessed as single-channel access while the striped data is accessed using multiple simultaneous accesses.

10. The three-level flash device of claim 9 wherein the second-level mapper further comprises:

a truncation process, activated on power-up, for determining a selected size of the NVM flash memory, and for setting a selected size of all NVM flash memory.

11. The three-level flash device of claim 9 wherein the high-level striping mapper further comprises:

a truncation process, activated on power-up, for determining a selected size of the plurality of flash channels, and for setting the selected size of all flash channels.

12. The three-level flash device of claim 9 wherein each second-level smart storage switch further comprises:

a channel error-correction code (ECC) unit for generating ECC, the ECC being sent to an assigned NVM flash memory coupled to an assigned NVM controller;

wherein the assigned NVM flash memory is diagonally distributed;

a hamming-code ECC unit, in the second-level smart storage switch, for detecting two-bit errors and for correcting single-bit errors using a hamming-code ECC circuit operating on data read back from the NVM flash memory;

wherein the ECC is sent to a redundant channel for storage in the NVM flash memory, whereby stripe ECC are generated and stored.

13. The three-level flash device of claim 9 wherein the high-level storage smart switch further comprises:

a high-level error-correction code (ECC) unit for appending channel ECC to data sent to the assigned flash channels, wherein the channel ECC is stored in the NVM flash memory;

wherein the assigned flash channels storing the channel ECC are diagonally distributed;

a hamming-code ECC unit, in the high-level smart storage switch, for generating a stripe ECC from a stripe of the host data, wherein the stripe is generated by the high-level striping mapper;

wherein the stripe ECC is sent to a stripe channel for storage in the NVM flash memory, whereby both stripe ECC and page ECC are generated and stored.

14. The three-level flash device of claim 9 wherein the high-level smart storage transaction manager further comprises:

an interleave unit, coupled to the virtual storage bridge, for interleaving host data to a plurality of interleaves of the plurality of flash channels attached to the NVM flash memory, whereby the plurality of flash channels are accessed in interleaves.

15. The three-level flash device of claim 9 wherein the second-level smart storage transaction manager further comprises:

an interleave unit, coupled to a virtual storage bridge of the second-level smart storage switch, for interleaving striped data to a plurality of interleaves of the plurality of channels attached to the NVM flash memory, whereby the plurality of NVM controllers are accessed in interleaves.

16. The three-level flash device of claim 9 wherein the high-level smart storage transaction manager further comprises:

a multi-channel parallel accessing unit, coupled to the virtual storage bridge, for parallel access of host data to a plurality of channels attached to a plurality of the second-level smart storage switch, whereby the plurality of the second-level smart storage switch are accessed in parallel.

17. The three-level flash device of claim 9 wherein the second-level smart storage transaction manager further comprises:

a multi-channel parallel accessing unit, coupled to a virtual storage bridge of second-level smart storage switch, for parallel access of striped data to a plurality of NVM controllers, whereby the plurality of NVM controllers are accessed in parallel.

18. The three-level flash device of claim 9 wherein the high-level smart storage switch further comprises:

a volatile memory buffer for temporarily storing host data in a volatile memory that loses data when power is disconnected;

a caching circuit, implemented by the volatile memory buffer, for storing associated buffer data from the upstream interface, the caching circuit for transaction buffering;

wherein the second-level smart storage switch further comprises:

second-level cache means for caching data in the plurality of NVM controllers, wherein the NVM controller further comprises:

low-level cache means for caching data in the NVM flash memory.

19. A smart storage switch two-level controller comprising:

a smart storage switch which comprises:

an upstream interface to a host for receiving host commands to access non-volatile memory (NVM) and for receiving host data and a host address;

a smart storage transaction manager that manages transactions from the host;

a virtual storage processor that maps the host address to an assigned flash channel to generate a logical block address (LBA), the virtual storage processor performing a high level of mapping;

a first-level striping mapper, coupled to the virtual storage processor, that stores a stripe capacity, which is the size of data that is accessible in parallel, and a scattered capacity, which is the size of data that cannot be accessed in parallel, for each flash channel, wherein the stripe capacity for all flash channels has a same value, wherein the scattered capacity varies among the flash channels;

a virtual storage bridge between the smart storage transaction manager and a NVM controller through a LBA bus;

a volatile memory buffer for temporarily storing host data in a volatile memory that loses data when power is disconnected;

a NVM controller, coupled to the LBA bus to receive the LBA generated by the virtual storage processor and the host data from the virtual storage bridge;

a low-level volatile memory buffer, coupled to the NVM controller, for buffering data; and a low-level mapper, in the NVM controller, that maps the LBA to a physical block address (PBA), the low-level mapper generating the PBA for block-mapped host data, and the low-level mapper generating the PBA and a page number for host data that is page-mapped.

20. A smart storage switch three-level controller comprising:

a first-level smart storage switch which comprises:

an upstream interface to a host for receiving host commands to access non-volatile memory (NVM) and for receiving host data and a host address;

a smart storage transaction manager that manages transactions from the host;

a virtual storage processor that maps the host address to an assigned flash channel to generate a logical block address (LBA), the virtual storage processor performing a high level of mapping;

a first-level striping mapper, coupled to the virtual storage processor, that stores a stripe capacity, which is the size of data that is accessible in parallel, and a scattered capacity, which is the size of data that cannot be accessed in parallel, for each flash channel, wherein the stripe capacity for all flash channels has a same value, wherein the scattered capacity varies among the flash channels;

a virtual storage bridge between the smart storage transaction manager and a LBA bus;

a volatile memory buffer for temporarily storing host data in a volatile memory that loses data when power is disconnected;

a second-level smart storage switch which comprises:

a second upstream interface to the first-level smart storage switch for receiving commands to access NVM and for receiving data and an address from the first-level smart storage switch;

a second-level smart storage transaction manager that manages transactions from the NVM devices;

a second-level stripping mapper, coupled to the channel storage processor, that stores capacities of all NVM devices for each flash channel;

a channel storage processor that maps the address from the first-level smart storage switch to an assigned flash channel to generate a local logical block address (LBA), the channel storage processor performing a mapping to multiple NVM devices attached to the second-level smart storage switch;

a NVM controller, coupled to the LBA bus to receive the LBA generated by the channel storage processor and the data from the second-level smart storage switch;

a low-level volatile memory buffer, coupled to the NVM controller, for buffering data; and a low-level mapper, in the NVM controller, that maps the LBA to a physical block address (PBA), the low-level mapper generating the PBA for block-mapped host data, and the low-level mapper generating the PBA and a page number for host data that is page-mapped.

21. A smart storage switch three-level controller comprising:

a first-level smart storage switch which comprises:

an upstream interface to a host for receiving host commands to access non-volatile memory (NVM) and for receiving host data and a host address;

a smart storage transaction manager that manages transactions from the host;

a virtual storage processor that maps the host address to an assigned flash channel to generate a logical block address (LBA), the virtual storage processor performing a high level of mapping;

a first-level striping mapper, coupled to the virtual storage processor, that stores a stripe capacity, which is the size of data that is accessible in parallel, and a scattered capacity, which is the size of data that cannot be accessed in parallel, for each flash channel, wherein the stripe capacity for all flash channels has a same value, wherein the scattered capacity varies among the flash channels;

a virtual storage bridge between the smart storage transaction manager and a LBA bus;

a second-level smart storage switch which comprises:

a second upstream interface to the first-level smart storage switch for receiving commands to access NVM and for receiving data and an address from the first-level smart storage switch;

a second-level smart storage transaction manager that manages transactions from the NVM devices;

a second-level stripping mapper, coupled to the channel storage processor, that stores capacities of all NVM devices for each flash channel;

a channel storage processor that maps the address from the first-level smart storage switch to an assigned flash channel to generate a local logical block address (LBA), the channel storage processor performing a mapping to multiple NVM devices attached to the second-level smart storage switch.

* * * * *